(12) United States Patent
Ihara

(10) Patent No.: US 8,962,394 B2
(45) Date of Patent: Feb. 24, 2015

(54) SEMICONDUCTOR DEVICE AND METHOD OF MANUFACTURING THE SAME

(71) Applicant: Fujitsu Semiconductor Limited, Yokohama-shi, Kanagawa (JP)

(72) Inventor: Takumi Ihara, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/475,897

(22) Filed: Sep. 3, 2014

(65) Prior Publication Data

US 2014/0370660 A1 Dec. 18, 2014

Related U.S. Application Data

(62) Division of application No. 13/358,660, filed on Jan. 26, 2012, now Pat. No. 8,853,851.

(30) Foreign Application Priority Data

Mar. 25, 2011 (JP) .................................. 2011-068176

(51) Int. Cl.
*H01L 21/44* (2006.01)
*H01L 21/48* (2006.01)
*H01L 23/00* (2006.01)
*H01L 21/56* (2006.01)

(52) U.S. Cl.
CPC ............ *H01L 21/4875* (2013.01); *H01L 24/83* (2013.01); *H01L 21/563* (2013.01)
USPC ....................................................... 438/122

(58) Field of Classification Search
CPC ........... H01L 2924/01078; H01L 2924/01079; H01L 2924/01029; H01L 2924/15311; H01L 23/4334

USPC ................. 438/121–122, 125, 117, 126–127; 257/705, 706–707, 712–720

See application file for complete search history.

(56) References Cited

U.S. PATENT DOCUMENTS 6,552,428 B1 * 4/2003 Huang et al. .................. 257/706
2007/0086170 A1 4/2007 Liang (Continued)

FOREIGN PATENT DOCUMENTS

CN 1449004 A 10/2003
CN 1953646 4/2007

(Continued)

OTHER PUBLICATIONS

Chinese Office Action issued Mar. 4, 2014 for corresponding Chinese Office Application No. 201210033157.5, with English Translation (12 pages).

(Continued)

*Primary Examiner* — Hoa B Trinh
(74) *Attorney, Agent, or Firm* — Fujitsu Patent Center

(57) ABSTRACT

A semiconductor device includes a substrate, a semiconductor element disposed on the substrate, and a heat conductive member composed of a solder material. The heat conductive member covers the semiconductor element, and is connected to a connection pad formed on the substrate. A heat radiator is disposed on the heat conductive member. The heat conductive member thermally connecting the semiconductor element to the heat radiator reduces the risk that electromagnetic noise may be emitted from or may be incident on the semiconductor element.

6 Claims, 31 Drawing Sheets

(56) References Cited

U.S. PATENT DOCUMENTS

2009/0091021 A1    4/2009    Nakamura
2010/0052156 A1    3/2010    Appelt et al.
2010/0327431 A1    12/2010    Touzelbaev et al.

FOREIGN PATENT DOCUMENTS

| | | |
|---|---|---|
| CN | 101661913 | 3/2010 |
| JP | 03-082144 | 4/1991 |
| JP | 04-032251 | 2/1992 |
| JP | 08-279576 | 10/1996 |
| JP | 2001-156086 | 6/2001 |
| JP | 2002-158317 | 5/2002 |
| JP | 2005-026373 | 1/2005 |
| JP | 2006-510235 | 3/2006 |
| JP | 2007-258430 | 10/2007 |
| JP | 2009-105366 | 5/2009 |
| WO | 2005-001934 A2 | 1/2005 |
| WO | 2005-001934 A3 | 1/2005 |

OTHER PUBLICATIONS

USPTO, (Trinh) Notice of Allowance and Notice of Allowability, Aug. 1, 2014, in U.S. Appl. No. 13/358,660 [allowed].

USPTO, (Trinh) Final Office Action, Apr. 14, 2014, in U.S. Appl. No. 13/358,660 [allowed].

USPTO, (Trinh) Non-Final Office Action, Oct. 11, 2013, in U.S. Appl. No. 13/358,660 [allowed].

USPTO, (Trinh) Restriction Requirement, Aug. 12, 2013, in U.S. Appl. No. 13/358,660 [allowed].

CNOA—The Second Office Action issued on Oct. 29, 2014 for corresponding Chinese Application No. 201210033157.5, with English language translation.

JPOA—Japanese Patent Office Action issued on Dec. 16, 2014 for corresponding Japanese Application No. 2011-068176, with partial English translation.

\* cited by examiner

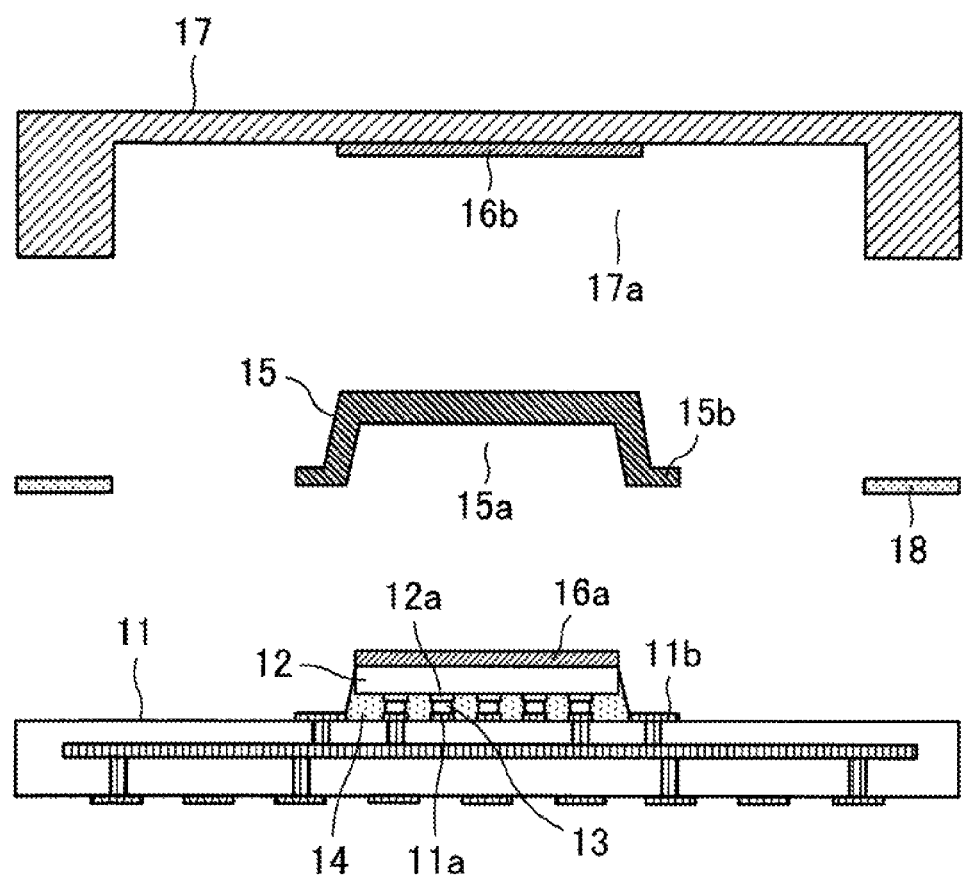

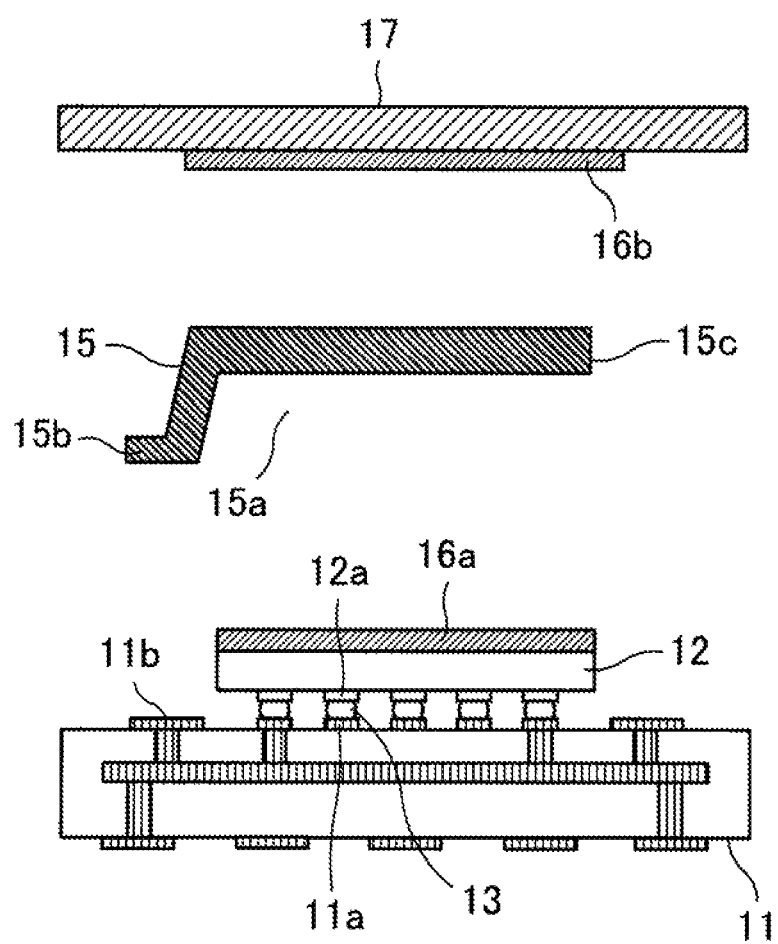

US 8,962,394 B2

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2011-068176, filed on Mar. 25, 2011, the entire contents of which are incorporated herein by reference.

FIELD

The embodiments discussed herein are related to semiconductor devices and methods of manufacturing the same.

BACKGROUND

In some technologies, heat generated at semiconductor elements included in semiconductor devices is dissipated using heat radiators such as heat spreaders, heat sinks, and radiator caps thermally connected to the semiconductor elements with heat conductive members interposed therebetween. In view of reducing the risk of malfunction of the semiconductor elements caused by electromagnetic noise, shielding members may be disposed on the peripheries of the semiconductor elements, or the heat radiators such as heat sinks and radiator caps may be used as the shielding members (see, for example, Japanese Laid-open Patent Publication Nos. 2009-105366, 2002-158317, and 2005-026373 and Japanese National Publication of International Patent Application No. 2006-510235).

The shielding members or the heat radiators used as the shielding members are disposed on the semiconductor elements or disposed so as to cover the semiconductor elements, and are electrically connected to conductive portions, for example, portions at a ground (GND) potential, of substrates on which the semiconductor elements are mounted. However, fabrication of these shielding members or heat radiators may lead to an increase in the number of parts of the semiconductor devices or relatively significant design changes, and may result in increases in, for example, cost and the number of assembling steps.

SUMMARY

According to an aspect of the present invention, a semiconductor device includes a substrate; an electrode portion disposed on the substrate; a semiconductor element disposed on the substrate; a heat conductive member composed of a solder material, the heat conductive member covering the semiconductor element and being connected to the electrode portion; and a heat radiator disposed on the heat conductive member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an example sealing-member placement step according to the first embodiment;

FIG. 18 illustrates an example sealing-member placement step according to the third embodiment;

DESCRIPTION OF EMBODIMENTS

Figure 1:
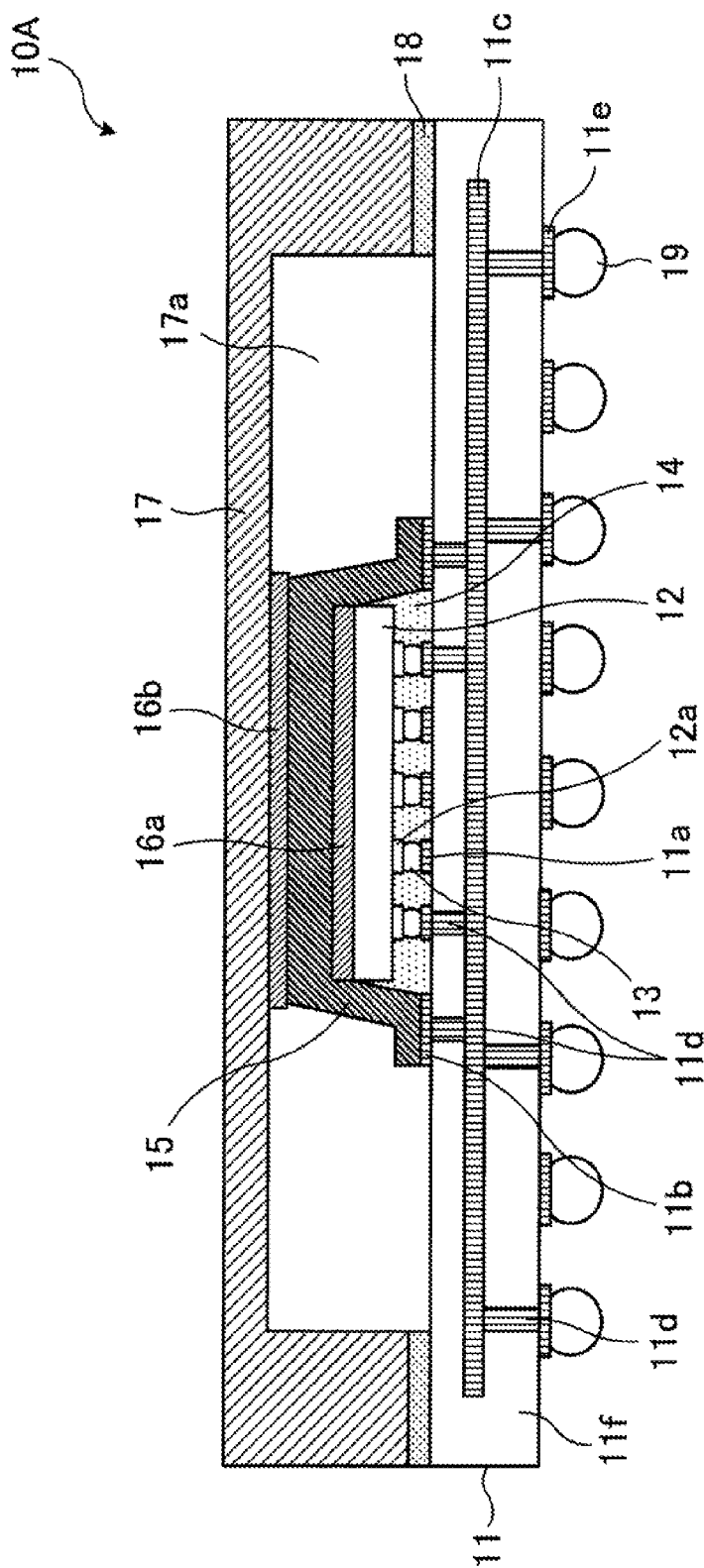
FIG. 1 illustrates an example semiconductor device according to a first embodiment.

Several embodiments will be described below with reference to the accompanying drawings, wherein like reference numerals refer to like elements throughout.

(a) First Embodiment

A first embodiment will now be described. FIG. 1 illustrates an example semiconductor device according to the first embodiment.

A semiconductor device 10A according to the first embodiment includes a substrate (wiring board) 11 and a semiconductor element (semiconductor chip) 12 disposed on the substrate 11.

The substrate 11 has electrode portions (substrate electrode pads) 11a disposed on a surface opposing the semiconductor element 12. The substrate electrode pads 11a are electrically connected by vias 11d to an internal wiring line 11c at a ground (GND) potential and signal lines (not illustrated) disposed inside the substrate 11.

The semiconductor element 12 has electrode portions (chip electrode pads) 12a disposed on a surface opposing the substrate 11 at positions corresponding to the substrate electrode pads 11a. The semiconductor element 12 is mounted (flip-chip mounted) on the substrate 11 by the chip electrode pads 12a connected to the opposing substrate electrode pads 11a with bumps 13 interposed therebetween.

An underfill resin 14 is disposed between the substrate 11 and the semiconductor element 12 and around the outer circumference of the semiconductor element 12.

The semiconductor device 10A includes a heat conductive member 15 covering the semiconductor element 12 mounted on the substrate 11. This heat conductive member 15 may be composed of a thermally and electrically conductive material having high workability.

For example, the heat conductive member 15 may be composed of a solder material.

The upper surface of the semiconductor element 12 and the heat conductive member 15 are joined to each other by a bonding layer 16a interposed therebetween. A metallized layer may be used as the bonding layer 16a. The metallized layer may be, for example, a layered structure (Ti/Au) including a titanium (Ti) layer and a gold (Au) layer. In addition, the metallized layer may be, for example, a layered structure (Ti/Ni—V/Au) including a Ti layer, a nickel-vanadium (Ni—V) layer, and a Au layer. These layered structures may be formed by, for example, sputtering. Moreover, a Ni-based plated layer may be used as the metallized layer serving as the bonding layer 16a as long as the metallized layer is connectable to the heat conductive member 15.

The heat conductive member 15 covers the upper surface of the semiconductor element 12, extends along the side surfaces of the semiconductor element 12 and the side surfaces (fillet portions) of the underfill resin 14, and is connected to an electrode portion (connection pad) 11b disposed on the substrate 11.

Figure 2:
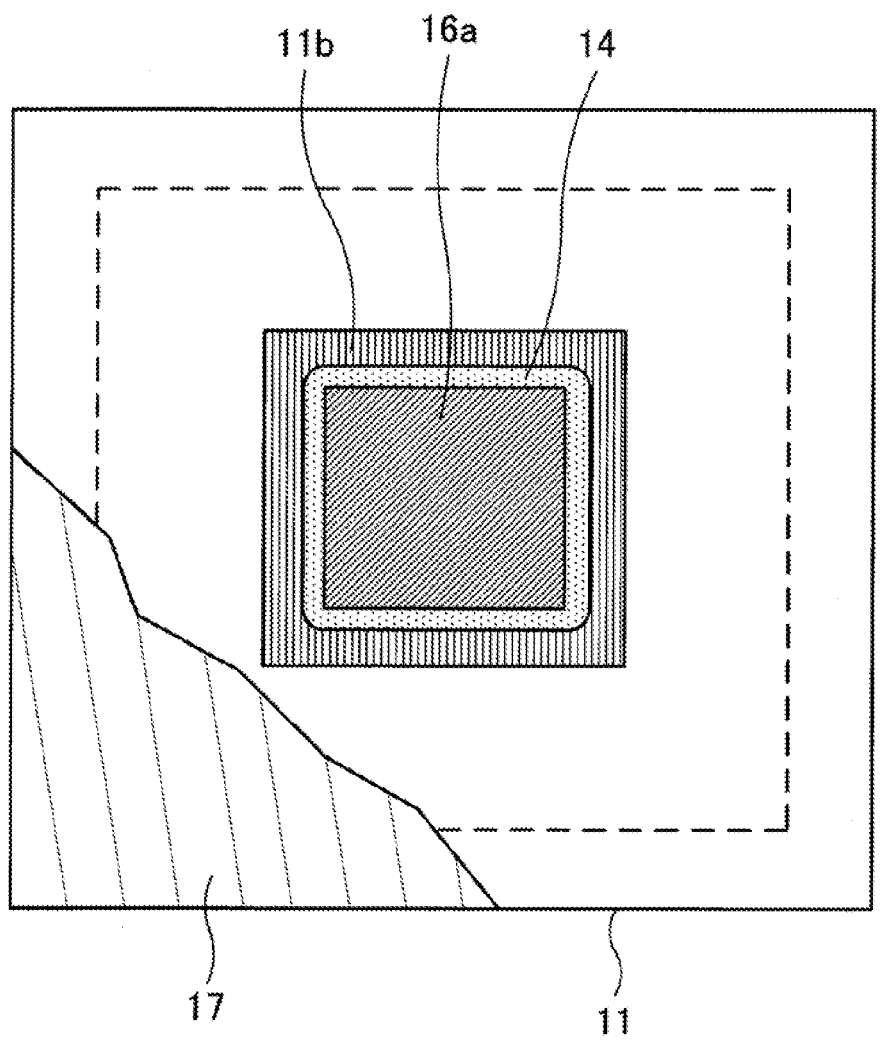
FIG. 2 is a schematic plan view of a principal part of the example semiconductor device according to the first embodiment.

FIG. 2 is a schematic plan view of a principal part of the example semiconductor device according to the first embodiment. In FIG. 2, the heat conductive member 15 is not illustrated.

In the semiconductor device 10A, the semiconductor element 12 having the bonding layer 16a disposed on the upper surface thereof is mounted on the substrate 11, and the underfill resin 14 is disposed between the substrate 11 and the semiconductor element 12 and around the outer circumference of the semiconductor element 12. The connection pad 11b is disposed on the substrate 11 so as to surround an area in which the semiconductor element 12 is mounted. The heat conductive member 15 covers the semiconductor element 12 mounted in the area inside the connection pad 11b, and is connected to the connection pad 11b.

As illustrated in FIG. 1, the connection pad 11b connected to the heat conductive member 15 is electrically connected by the vias 11d to the internal wiring line 11c at the GND potential disposed inside the substrate 11. The heat conductive member 15 connected to the connection pad 11b as above functions as a shielding member that reduces the risk of emission of electromagnetic noise from the semiconductor element 12 or incidence of electromagnetic noise from the outside to the semiconductor element 12.

Figure 3:
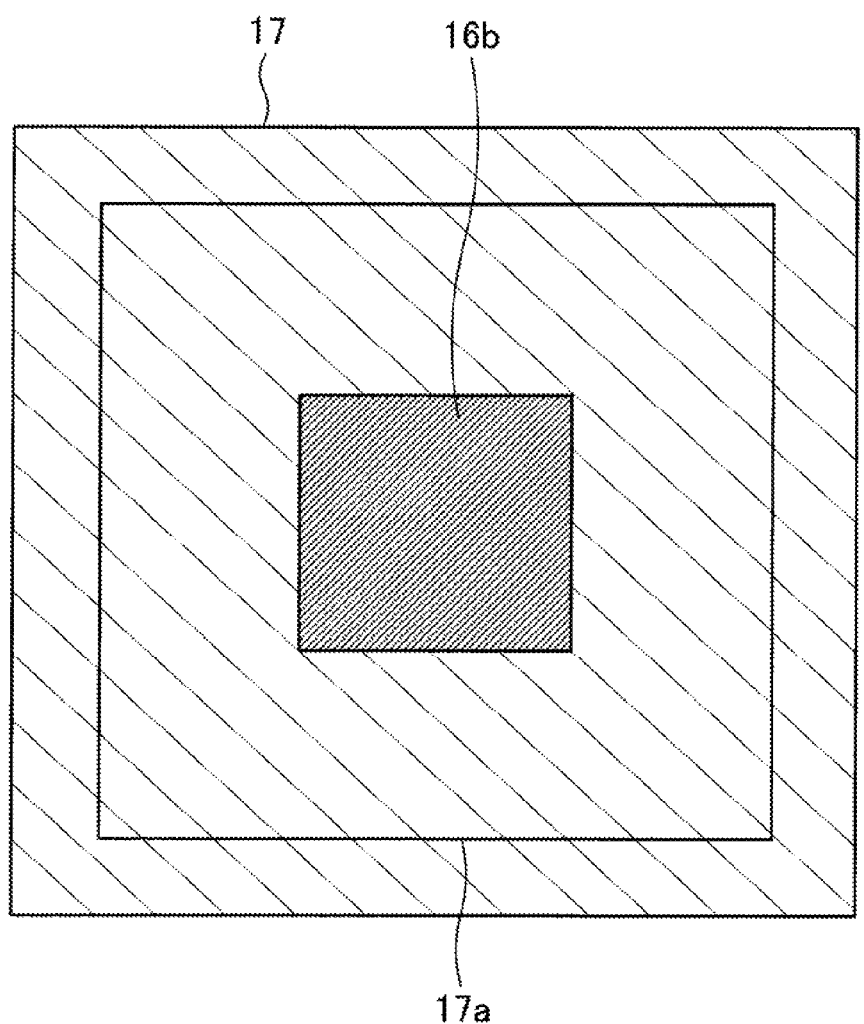
FIG. 3 is a schematic plan view from above a recessed portion of a heat radiator.

A heat radiator 17 is disposed on a surface, of the substrate 11, on which the semiconductor element 12 is mounted. FIG. 3 is a schematic plan view from above a recessed portion 17a of the heat radiator 17.

The heat radiator 17 has the recessed portion 17a illustrated in FIGS. 1 and 3. The heat radiator 17 is disposed on the substrate 11 such that the semiconductor element 12 and the heat conductive member that covers the semiconductor element 12 are accommodated in the recessed portion 17a. A bonding layer 16b is disposed in the recessed portion 17a of the heat radiator 17. As illustrated in FIG. 1, the heat radiator 17 is joined to the heat conductive member 15 by the bonding layer 16b, and is bonded to the substrate 11 by an adhesive 18.

The heat radiator 17 may be composed of a material having a high thermal conductivity and an excellent heat dissipation characteristic. For example, the heat radiator 17 may be composed of copper (Cu), aluminum (Al), aluminum silicon carbide (AlSiC), aluminum carbon (AlC), or silicon rubber.

The bonding layer 16b disposed in the recessed portion 17a of the heat radiator 17 may be a metallized layer. The metallized layer may be, for example, a layered structure (Ni/Au) including a Ni layer and a Au layer. The Ni/Au layered structure may be formed by, for example, plating. Moreover, a tin (Sn) layer, a silver (Ag) layer, or a Ni layer formed by, for example, plating may be used as the metallized layer serving as the bonding layer 16b as long as the metallized layer is connectable to the heat conductive member 15. Furthermore, a Cu layer or an Al layer, for example, may also be used as the metallized layer depending on the material of the heat radiator 17.

Electrode portions (ball pads) 11e are disposed on a surface of the substrate 11 opposite to that on which the semiconductor element 12 is mounted. The ball pads 11e are electrically connected by the vias 11d to the internal wiring line 11c at the GND potential and the signal lines (not illustrated). Solder balls 19 are attached to the ball pads 11e. The semiconductor device 10A may be mounted on another substrate (wiring board) such as a mother board and an interposer using the solder balls 19 and the ball pads 11e.

The conductive portions including the substrate electrode pads 11a, the connection pad 11b, the internal wiring line 11c, the vias 11d, the ball pads 11e, and the signal lines (not illustrated) provided for the substrate 11 may be composed of conductive materials such as Cu and Al.

The semiconductor device 10A having the above-described structure efficiently transfers heat generated at the semiconductor element 12 to the heat radiator 17 through the heat conductive member 15. This reduces the risk of overheating of the semiconductor element 12, and thereby reduces the risk of malfunction or breakage of the semiconductor element 12 caused by the overheating.

In addition, the heat conductive member 15 that thermally connects the semiconductor element 12 to the heat radiator 17 covers the semiconductor element 12, and is connected to the connection pad 11b at the GND potential in the semiconductor device 10A. As a result, the heat conductive member 15 functions as a shielding member, and effectively reduces the risk that electromagnetic noise may be emitted from or may be incident on the semiconductor element 12, thereby reducing the risk of malfunction of the semiconductor element 12.

Furthermore, significant design or structural changes in the substrate 11 are not necessary since the heat conductive member 15 functioning as the shielding member is at the GND potential. This allows the semiconductor device 10A having the functions of heat dissipation and electromagnetic shielding to be manufactured with the least increase in cost.

Next, a method of forming (assembling) the semiconductor device 10A will be described.

Figure 4A:
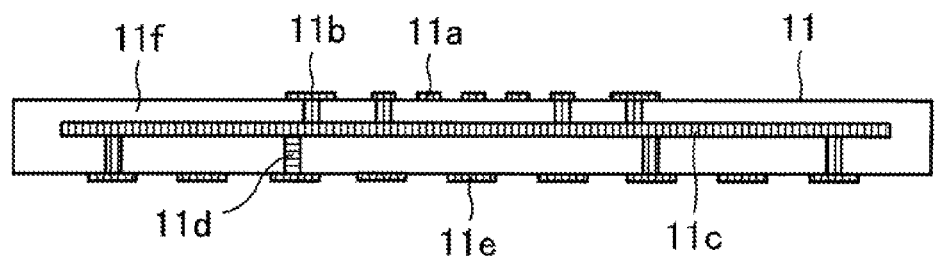
FIGS. 4A and 4B illustrate an example substrate preparation step according to the first embodiment.
Figure 4B:
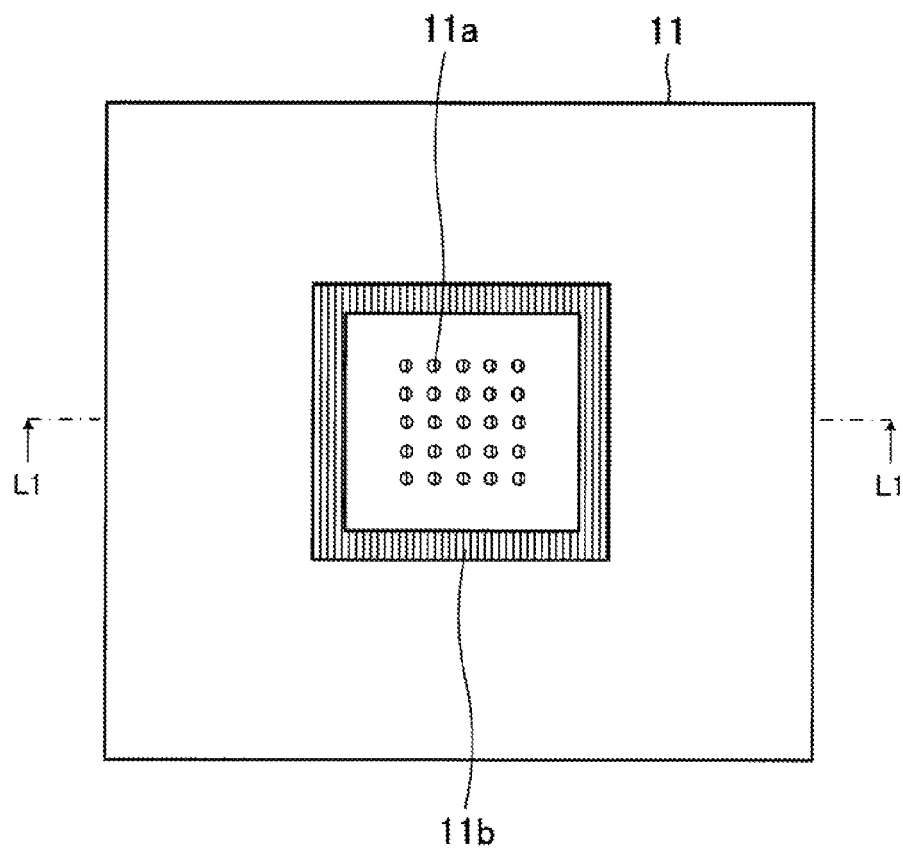

FIGS. 4A and 4B illustrate an example substrate preparation step according to the first embodiment. FIG. 4A is a schematic cross-section taken along line L1-L1 in FIG. 4B, and FIG. 4B is a schematic plan view.

On the formation of the semiconductor device 10A, the substrate 11 as illustrated in FIGS. 4A and 4B is prepared first. The substrate 11 has the internal wiring line 11c at the GND potential and the vias 11d connected to the internal wiring line 11c disposed inside an insulating portion 11f.

The substrate 11 has the substrate electrode pads 11a and the connection pad 11b on one of the main surfaces thereof. The substrate electrode pads 11a are disposed in an area in which the semiconductor element 12 is to be mounted, and the connection pad 11b surrounds the area. The substrate 11 has the ball pads 11e on the other main surface, the solder balls 19 being attachable to the ball pads 11e.

Herein, signal lines inside the substrate 11 are not illustrated.

The semiconductor element 12 is mounted on this substrate 11.

Figure 5A:
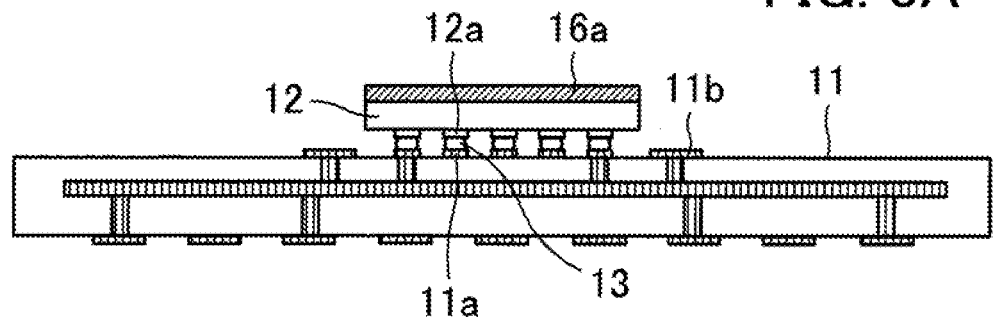
FIGS. 5A and 5B illustrate an example semiconductor-element mounting step according to the first embodiment.
Figure 5B:
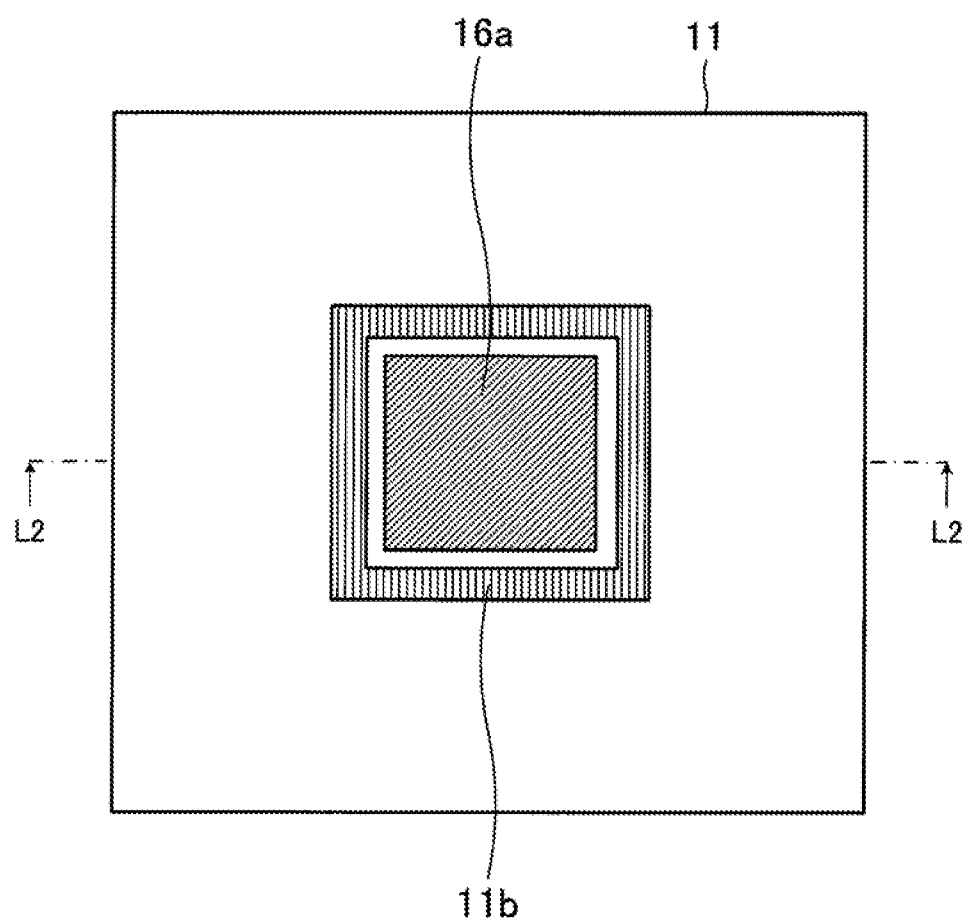

FIGS. 5A and 5B illustrate an example semiconductor-element mounting step according to the first embodiment. FIG. 5A is a schematic cross-section taken along line L2-L2 in FIG. 5B, and FIG. 5B is a schematic plan view.

The semiconductor element 12 to be mounted has the chip electrode pads 12a, the bumps 13 attached to the chip electrode pads 12a, and a bonding layer 16a on a surface opposite to that to which the bumps 13 are attached.

The bumps 13 attached to the chip electrode pads 12a are aligned with the substrate electrode pads 11a, and the chip electrode pads 12a and the substrate electrode pads 11a are connected to each other with the bumps 13 interposed therebetween. In this manner, the semiconductor element 12 is flip-chip mounted on the substrate 11. The semiconductor element 12 may be mounted on the substrate 11 with, for example, a flip-chip bonder.

After the semiconductor element 12 is mounted on the substrate 11, application of the underfill resin 14 is performed.

Figure 6A:
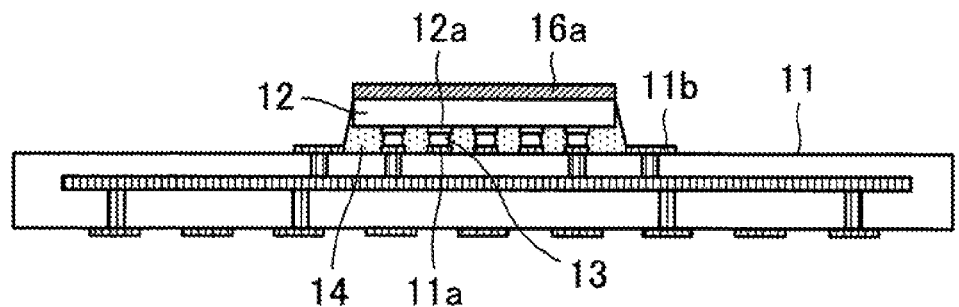
FIGS. 6A and 6B illustrate an example underfill-resin application step according to the first embodiment.
Figure 6B:
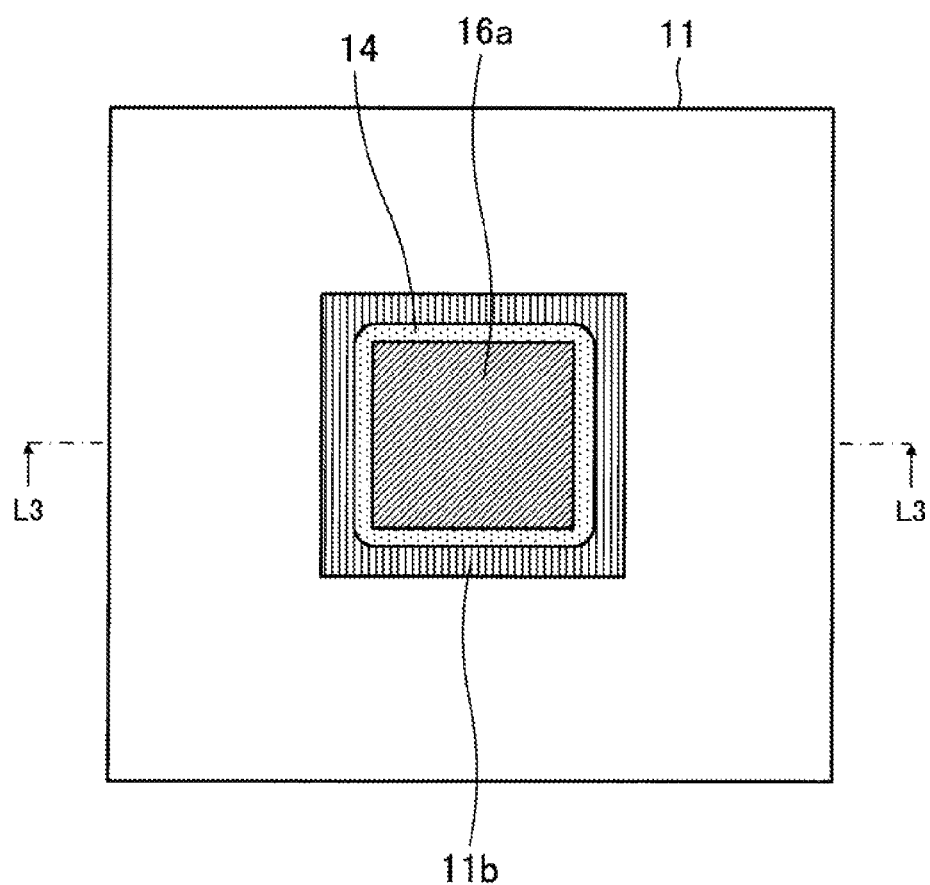

FIGS. 6A and 6B illustrate an example underfill-resin application step according to the first embodiment. FIG. 6A is a schematic cross-section taken along line L3-L3 in FIG. 6B, and FIG. 6B is a schematic plan view.

The underfill resin 14 is applied to a space between the substrate 11 and the semiconductor element 12 mounted on the substrate 11, and is cured in the space. The underfill resin 14 may also be formed around the outer circumference of the semiconductor element 12. The application of the underfill resin 14 firmly connects the substrate 11 and the semiconductor element 12, and improves the reliability of connections therebetween.

Next, the heat conductive member 15, serving as a sealing member that seals the periphery of the semiconductor element 12, and the heat radiator 17 are disposed on the substrate 11 on which the semiconductor element 12 is mounted as above.

FIG. 7 illustrates an example sealing-member placement step according to the first embodiment.

Herein, the heat conductive member 15 covering the semiconductor element 12 has, for example, a recessed portion 15a having a shape corresponding to the semiconductor element 12 (shape corresponding to the external shape of the semiconductor element 12) and a connecting portion 15b to be connected to the connection pad 11b. The heat conductive member 15 will be described in detail below.

The heat radiator 17 has the recessed portion 17a capable of accommodating the semiconductor element 12 and the heat conductive member 15, and is provided with the bonding layer 16b disposed in the recessed portion 17a at a position where the bonding layer 16b is to be joined to the heat conductive member 15.

The heat conductive member 15 is disposed on the semiconductor element 12, and the heat radiator 17 is disposed on the heat conductive member 15. The adhesive 18 is disposed between the heat radiator 17 and the substrate 11. The semiconductor element 12 is then sealed by the heat conductive member 15, the heat radiator 17 provided with the bonding layer 16b, and the adhesive 18 disposed as above.

Figure 8A:
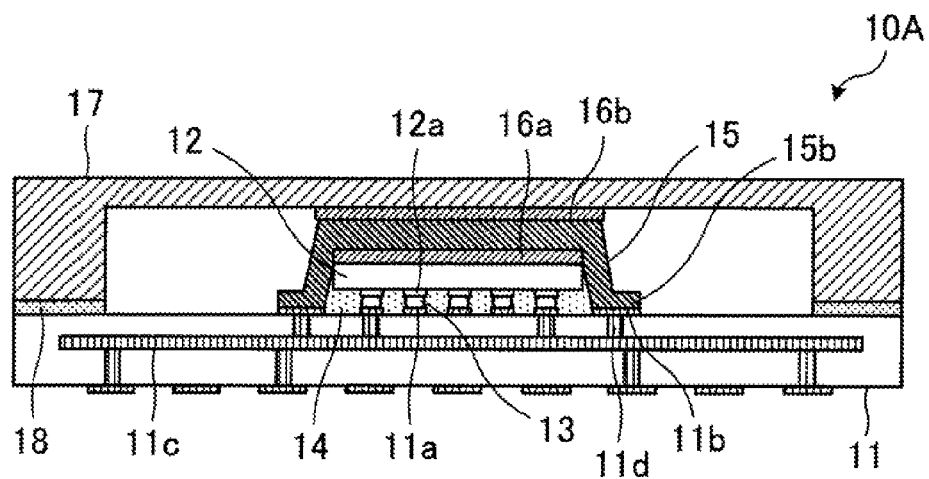
FIGS. 8A and 8B illustrate an example sealing step according to the first embodiment.
Figure 8B:
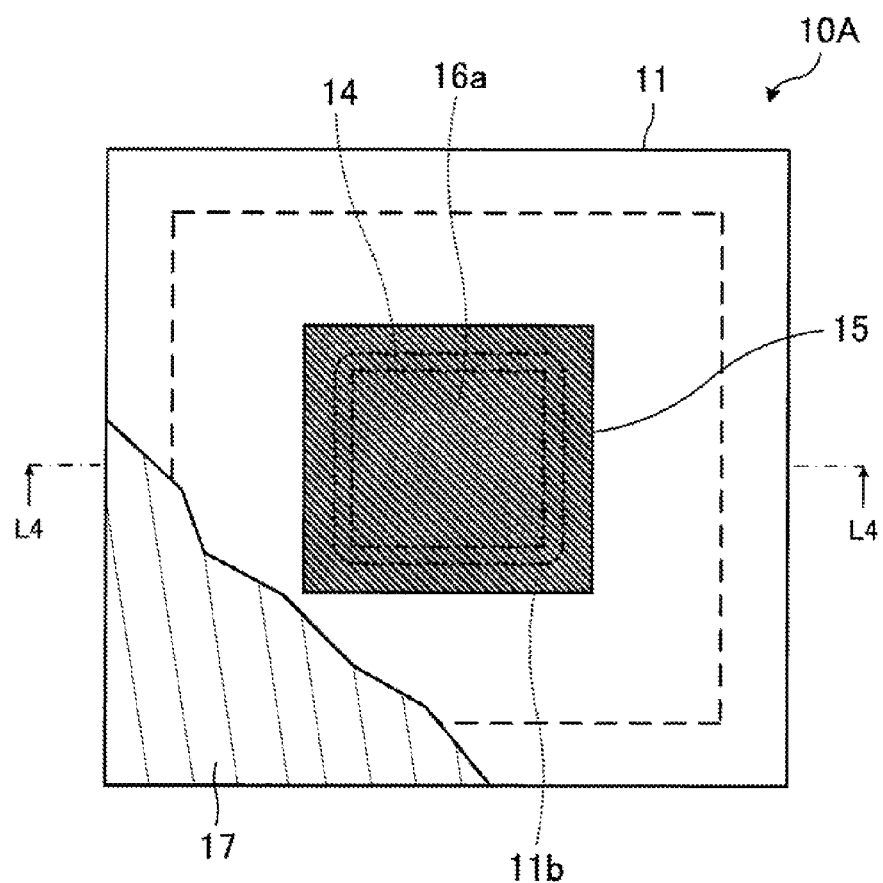

FIGS. 8A and 8B illustrate an example sealing step according to the first embodiment. FIG. 8A is a schematic cross-section taken along line L4-L4 in FIG. 8B, and FIG. 8B is a schematic plan view.

To seal the semiconductor element 12, the heat radiator 17 is pressed toward the substrate 11 with the heat conductive member 15 interposed between the heat radiator 17 and the semiconductor element 12 mounted on the substrate 11. With this, the heat radiator 17 is bonded to the substrate 11 by the adhesive 18, the heat conductive member 15 is connected to the bonding layers 16a and 16b, and the connecting portion 15b of the heat conductive member 15 is connected to the connection pad 11b.

The semiconductor element 12 is covered by the heat conductive member 15 by pressing the heat radiator as above. During pressing of the heat radiator 17, the heat conductive member 15 is brought into close contact with the bonding layers 16a and 16b and the connection pad 11b. In addition, in order for the heat conductive member 15 to be brought into close contact with the side surfaces of the semiconductor element 12 and the underfill resin 14, the heat conductive member 15 may be preferably heated so as to be melted or softened. Pressing of the heat radiator 17 and the adhesiveness of the heat conductive member 15 will be described in detail below.

After the sealing, the solder balls 19 are attached to the substrate 11.

Figure 9A:
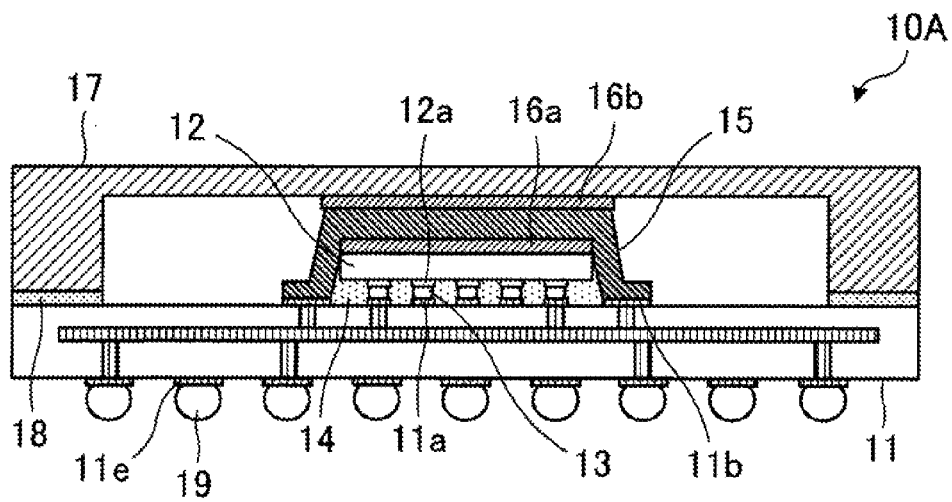
FIGS. 9A and 9B illustrate an example ball attachment step according to the first embodiment.
Figure 9B:
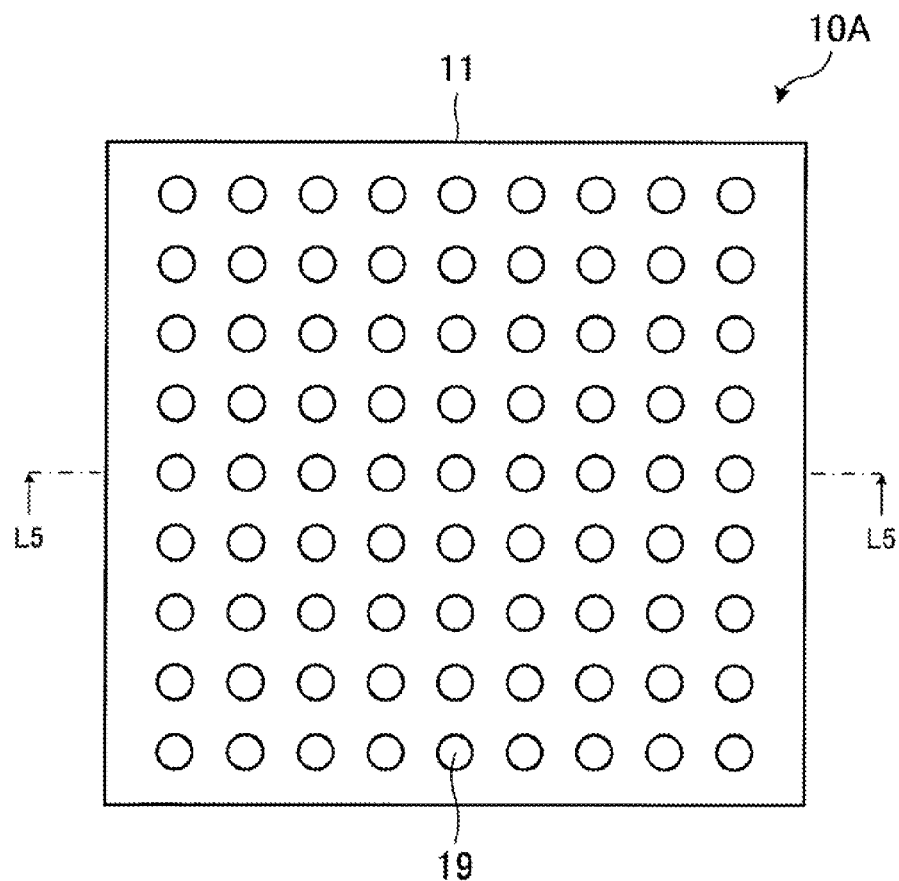

FIGS. 9A and 9B illustrate an example ball attachment step according to the first embodiment. FIG. 9A is a schematic cross-section taken along line L5-L5 in FIG. 9B, and FIG. 9B is a schematic plan view from above the surface to which the balls are attached.

The solder balls 19 are attached to the ball pads 11e disposed on the surface of the substrate 11 opposite to that on which the semiconductor element 12 is mounted. This completes the formation of the semiconductor device 10A of the ball grid array (BGA) type. The semiconductor device 10A may be of the land grid array (LGA) type that does not have the solder balls 19 attached thereto (see FIG. 8).

The heat conductive member 15 will now be described in more detail.

The heat conductive member 15 may be composed of a solder material. Materials to be used as the solder material may vary widely in the properties and the compositions. For example, materials based on indium (In), indium-silver (In—

Ag), tin-lead (Sn—Pb), tin-bismuth (Sn—Bi), tin-silver (Sn—Ag), tin-antimony (Sn—Sb), and tin-zinc (Sn—Zn) may be used as the solder material.

The heat conductive member 15 composed of the above-described solder material and having predetermined dimensions and shape, for example, may be prepared before assembling the semiconductor device 10A.

The dimensions and the shape of the heat conductive member 15 will now be described.

Figure 10A:
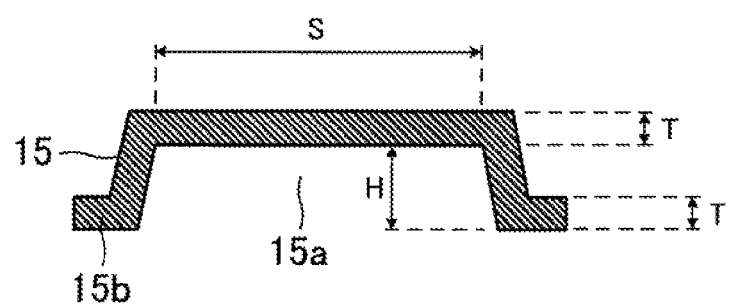
FIGS. 10A and 10B illustrate an example heat conductive member.
Figure 10B:
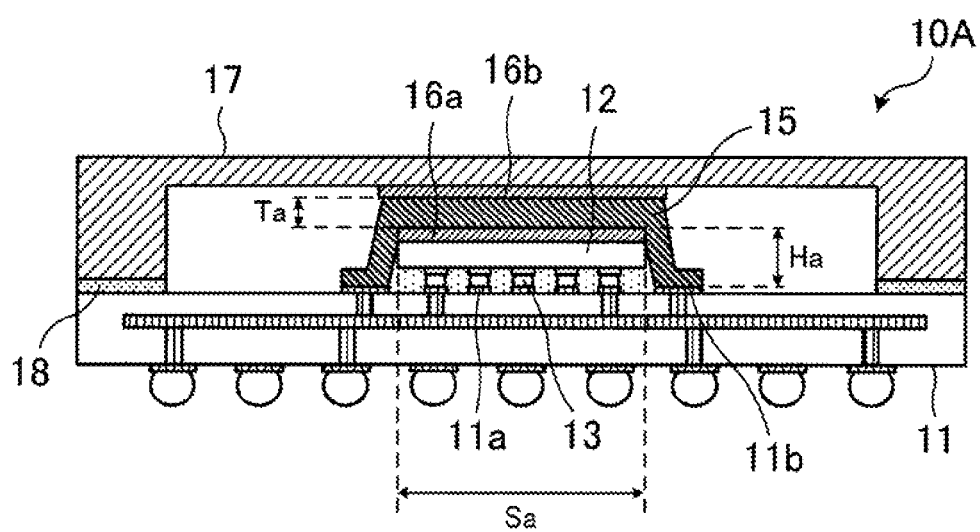

FIGS. 10A and 10B illustrate an example heat conductive member. FIG. 10A is a schematic cross-section of the heat conductive member before assembling, and FIG. 10B is a schematic cross-section of the semiconductor device after assembling.

As illustrated in FIG. 10A, the heat conductive member 15 is formed of a tabular body having a predetermined thickness T, and has the recessed portion 15a having a predetermined plane size S and a height H before assembling the semiconductor device 10A. The plane size S and the height H of the recessed portion 15a may be set on the basis of the outside size Sa and the mounting height Ha of the semiconductor element 12 to be mounted on the substrate 11 as illustrated in FIG. 10B. Herein, the mounting height Ha is defined as a height from the substrate electrode pads 11a (or the connection pad 11b) to the surface of the bonding layer 16a disposed on the semiconductor element 12.

For example, the plane size S of the recessed portion 15a of the heat conductive member 15 is set to the outside size Sa of the semiconductor element 12, and the height H of the recessed portion 15a is set to the mounting height Ha. Herein, the semiconductor element 12 has an outside size Sa of 20.0 mm×20.0 mm and a mounting height Ha of 0.610 mm (the thickness of the semiconductor element 12 is 0.550 mm and that of the bumps 13 is 0.060 mm), for example. In this case, the heat conductive member 15 before assembling may have a thickness T of 0.350 mm, and the recessed portion 15a may have a plane size S of 20.0 mm×20.0 mm and a height H of 0.610 mm.

The actual mounting height Ha may vary for each semiconductor device 10A to be assembled. This may result in a difference between the actual mounting height Ha and the height of the recessed portion 15a of the heat conductive member 15 prepared so as to have predetermined dimensions and shape in advance in each semiconductor device 10A.

When there is such a difference in the height, the height (thickness Ta) of a part of the heat conductive member 15 located between the upper surface of the semiconductor element 12 and the heat radiator 17 is adjusted by adjusting the pressure (amount of push) to the heat radiator 17. This adjustment removes the difference between the height of the recessed portion 15a before assembling and the actual mounting height Ha.

When the heat radiator 17 is pressed toward the substrate 11, the heat conductive member 15 composed of a solder material may be melted or softened by heating. The heat conductive member 15 may also remain solidified without being heated.

The heat conductive member 15 is preferably composed of a solder material as described above in view of, for example, heat transferability from the semiconductor element 12 to the heat radiator 17, workability depending on the form of the semiconductor element 12, and connectivity to the bonding layers 16a and 16b and the connection pad 11b.

To remove the difference in the height, relationship between the mounting height Ha and the amount of push to the heat radiator 17 may be determined in advance, and the amount of push of the heat radiator 17 may be adjusted on the basis of the actual mounting height Ha. In addition, the thickness, the elasticity, or other parameters of the adhesive 18 that bonds the heat radiator 17 to the substrate 11 may be adjusted in advance so as to remove the difference in the height.

Although the heat conductive member 15 herein has the connecting portion 15b that may be brought into surface contact with the connection pad 11b during assembling, the heat conductive member 15 does not necessarily need to have the connecting portion 15b before assembling as long as the heat conductive member 15 is connected to the connection pad 11b after assembling.

The recessed portion 15a of the heat conductive member 15 having the size depending on the outside size of the semiconductor element 12 may reduce the risk of displacement between the heat conductive member 15 and the heat radiator 17 during assembling of the semiconductor device 10A.

Figure 11:
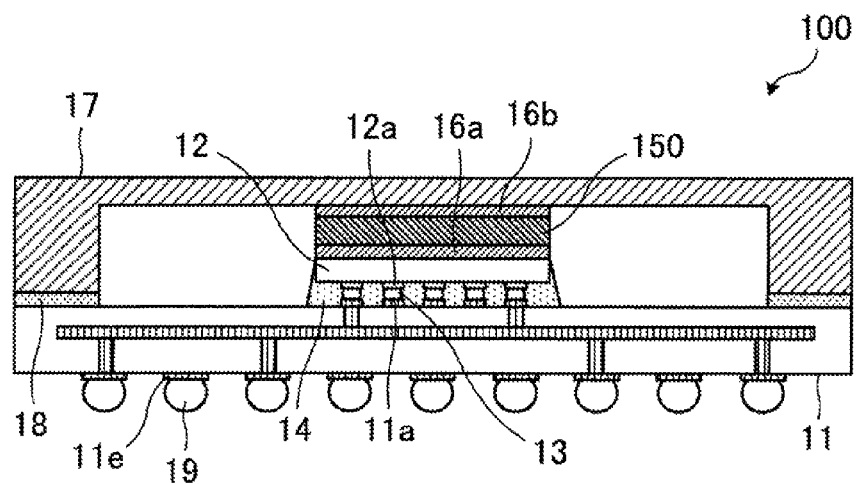
FIG. 11 illustrates an example semiconductor device of another form.
Figure 12A:
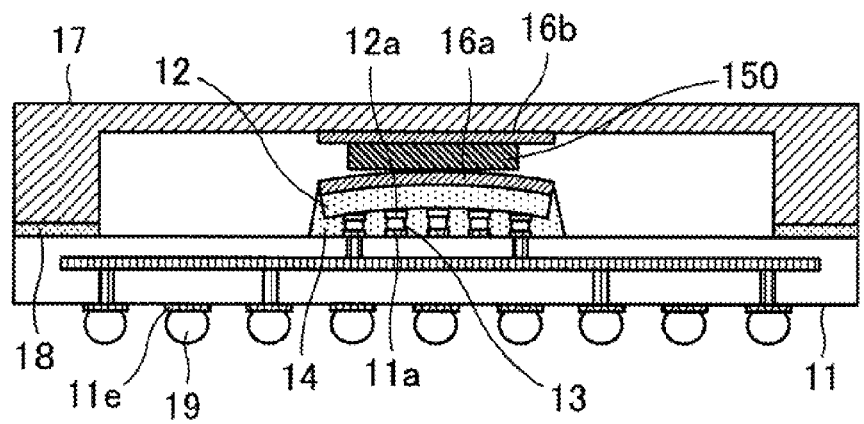
FIGS. 12A and 12B illustrate an example of how the semiconductor device of the other form is formed.
Figure 12B:
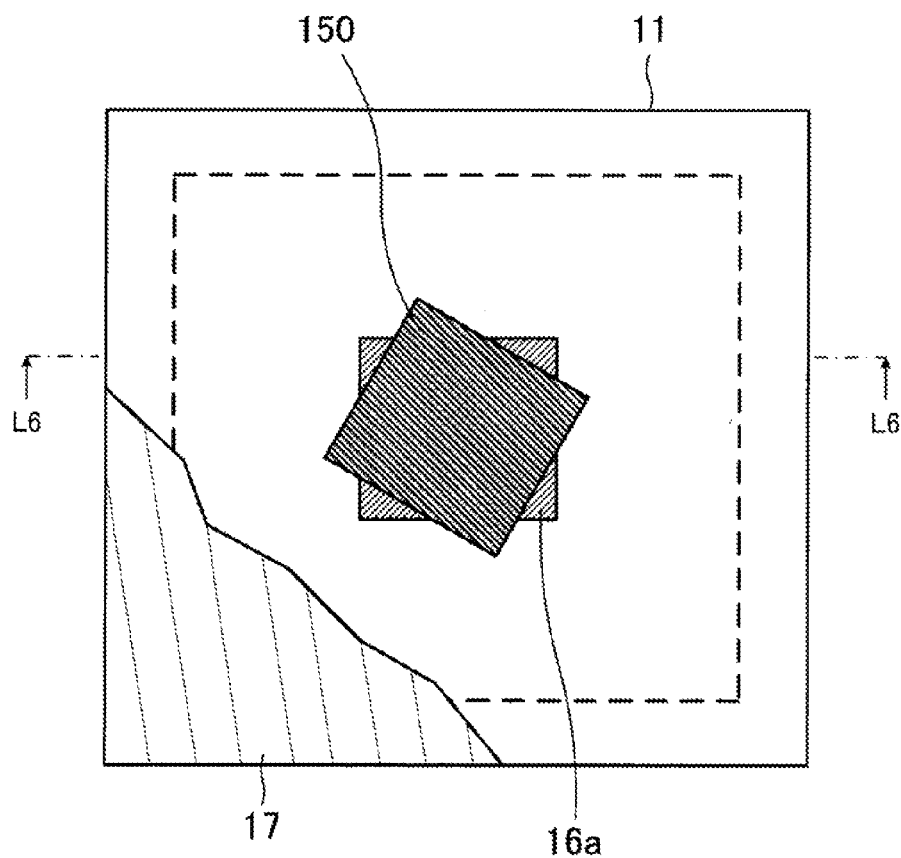
Figure 13A:
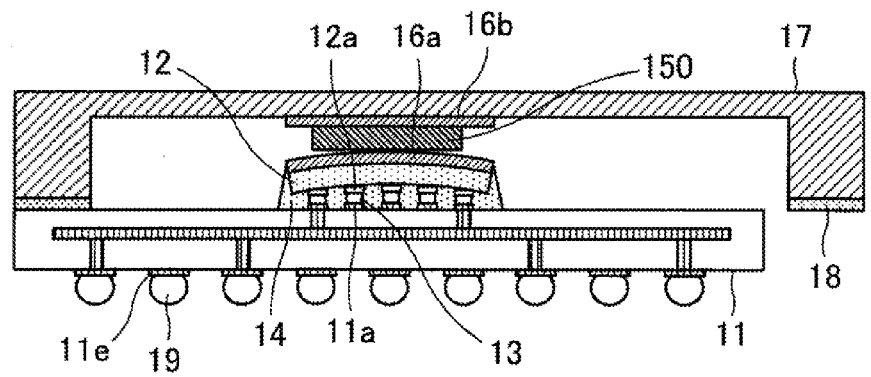
FIGS. 13A and 13B illustrate another example of how the semiconductor device of the other form is formed.
Figure 13B:
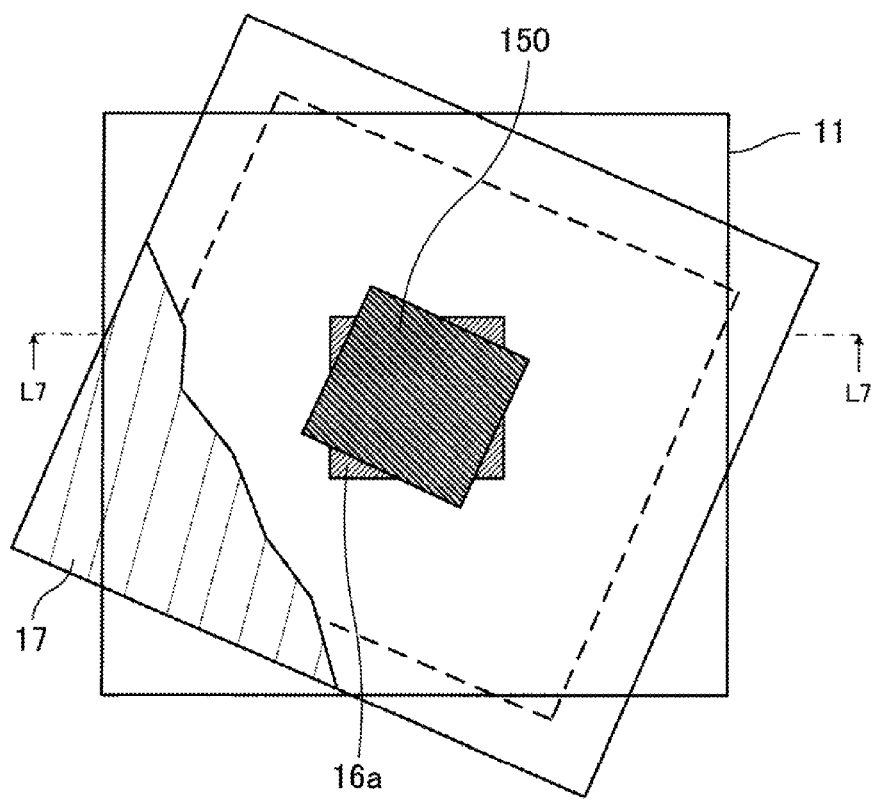

For comparison, FIG. 11 illustrates an example semiconductor device of another form, and FIGS. 12A to 13B illustrate examples of how the semiconductor device of the other form is formed. FIG. 11 is a schematic cross-section. FIG. 12A is a schematic cross-section taken along line L6-L6 in FIG. 12B, and FIG. 13A is a schematic cross-sections taken along line L7-L7 in FIG. 13B. FIGS. 12B and 13B are schematic plan views.

The surface of the semiconductor element 12 adjacent to the bonding layer 16a is not necessarily flat after the semiconductor element 12 is mounted on the substrate 11. The semiconductor element 12 may warp due to differences in thermal expansion and thermal shrinkage between the semiconductor element 12 and the substrate 11. When a tabular heat conductive member 150 as illustrated in FIGS. 12A to 13B is disposed on the semiconductor element 12 warping as above, the heat conductive member 150 or the heat radiator 17 may be displaced.

For example, the tabular heat conductive member 150 is disposed between the semiconductor element provided with the bonding layer 16a and the heat radiator 17 provided with the bonding layer 16b, and the heat radiator 17 is bonded to the substrate 11. At this moment, the heat conductive member 150 disposed on the semiconductor element 12 may rotate about the protruding portion of the warping semiconductor element 12, and may be displaced as illustrated in FIGS. 12A and 12B. In addition, the heat radiator 17 disposed on the heat conductive member 150 may rotate together with the heat conductive member 150, and both the heat conductive member 150 and the heat radiator 17 may be displaced as illustrated in FIGS. 13A and 13B.

If the heat conductive member 150 is fixed while being displaced, the upper surface of the semiconductor element 12 partially remains uncovered by the heat conductive member 150, and thereby precludes the formation of a semiconductor device 100 as illustrated in FIG. 11. Portions of the upper surface of the semiconductor element 12 uncovered by the heat conductive member 150 may cause an increase in thermal resistance to the heat radiator 17, and may prevent heat generated at the semiconductor element 12 from being sufficiently transferred to and released from the heat radiator 17. This may result in overheating of the semiconductor element 12, and therefore in malfunction of the semiconductor element 12. In addition, this may cause a reduction in the yield of the semiconductor device 100.

In contrast, the semiconductor device 10A described above includes the heat conductive member 15 having the recessed portion 15a, and the dimensions and the shape of the recessed portion 15a are set on the basis of the outside size and the mounting height of the semiconductor element 12 after mounting. With this, each inner side (or inner surface) of the recessed portion 15a opposes the corresponding outer side (or side surface) of the semiconductor element 12 during assembling, thereby reducing the risk of the rotation of the heat conductive member 15. As a result, the heat conductive member 15 is accurately positioned on the upper surface of the semiconductor element 12, and covers the upper surface and the side surfaces of the semiconductor element 12 in addition to the side surfaces of the underfill resin 14.

In addition, as illustrated in FIGS. 7, 8A, and 8B, the heat conductive member 15 having the recessed portion 15a is disposed on the semiconductor element 12, and the heat radiator 17 is pressed toward the substrate 11 while, for example, the heat conductive member 15 is heated. At this moment, connections between the heat conductive member 15 and the bonding layer 16a provided for the semiconductor element 12, between the heat conductive member 15 and the bonding layer 16b provided for the heat radiator 17, and between the heat conductive member 15 and the connection pad 11b at the GND potential are performed in a single step. In this manner, the semiconductor device 10A, having the functions of heat dissipation and electromagnetic shielding, is efficiently assembled.

(b) Second Embodiment

Figure 14A:
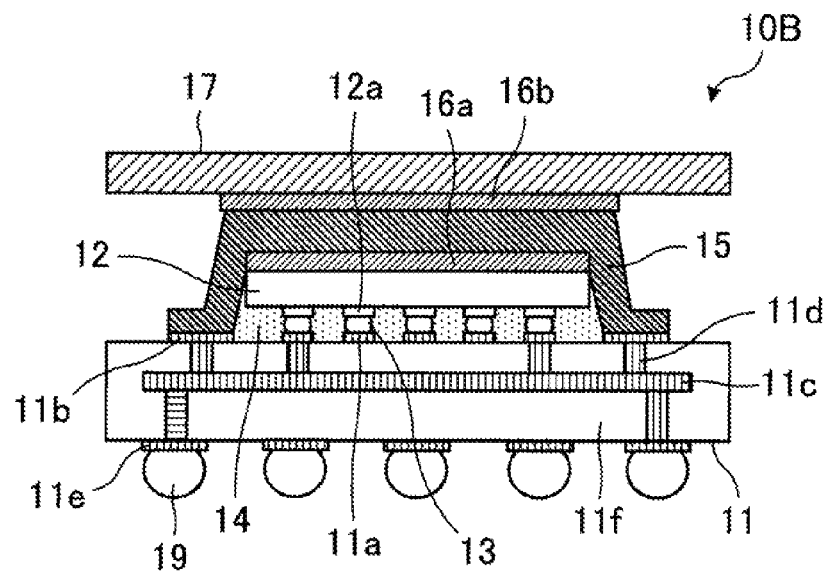
FIGS. 14A and 14B illustrate an example semiconductor device according to a second embodiment.
Figure 14B:
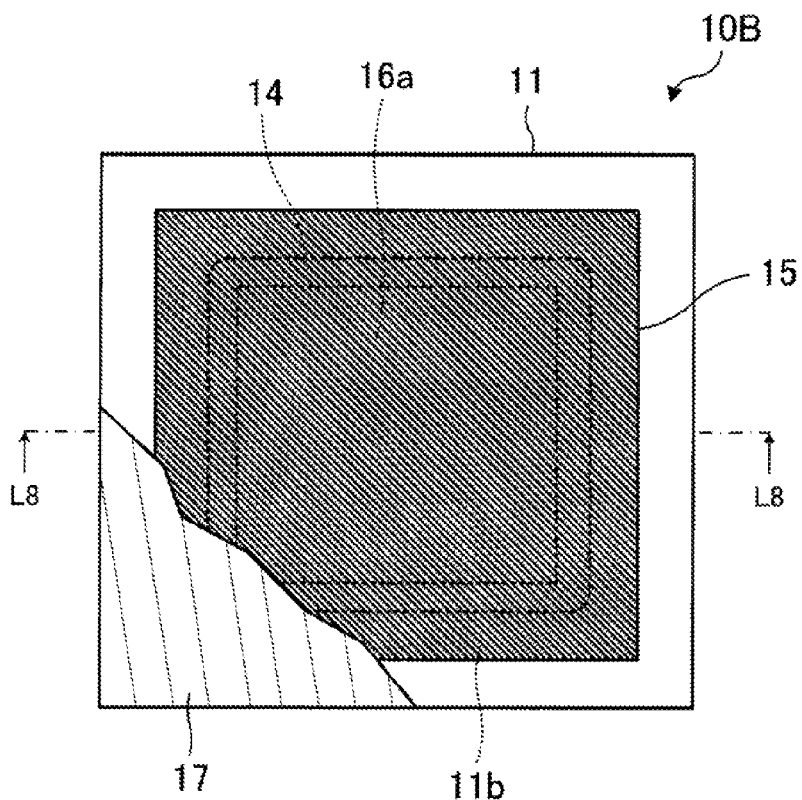

A second embodiment will now be described. FIGS. 14A and 14B illustrate an example semiconductor device according to the second embodiment. FIG. 14A is a schematic cross-section taken along line L8-L8 in FIG. 14B, and FIG. 14B is a schematic plan view.

A semiconductor device 10B according to the second embodiment differs from the semiconductor device 10A according to the first embodiment in that the semiconductor device 10B includes a small substrate 11 and a small tabular heat radiator 17.

In the semiconductor device 10B, the heat radiator 17 does not need to have a structure surrounding the periphery of a semiconductor element 12 and to be connected to the substrate 11, that is, a recessed portion 17a unlike the semiconductor device 10A according to the first embodiment. Since this small tabular heat radiator 17 is used, the substrate 11 does not need to have an area to which the heat radiator 17 is bonded, and an adhesive 18 used to bond the heat radiator 17 to the substrate 11 is also not necessary.

The use of the heat radiator 17 and the substrate 11 as illustrated in FIGS. 14A and 14B allows the small semiconductor device 10B, using a heat conductive member 15 thermally connecting the semiconductor element 12 to the heat radiator 17 as a shielding member, to be realized.

This semiconductor device 10B may be formed in a manner similar to that described in the first embodiment.

That is, the semiconductor element 12 provided with a bonding layer 16a is flip-chip mounted on the small substrate 11 with bumps 13 interposed therebetween first. Subsequently, an underfill resin 14 is applied between the substrate 11 and the semiconductor element 12. The tabular heat conductive member 15 is then disposed on the semiconductor element 12 and the bonding layer 16a, and the heat radiator 17 provided with a bonding layer 16b is disposed on the heat conductive member 15. The heat radiator 17 is pressed toward the substrate 11 while, for example, the heat conductive member 15 is heated. At this moment, connections between the heat conductive member 15 and the bonding layer 16a, between the heat conductive member 15 and the bonding layer 16b, and between the heat conductive member 15 and a connection pad 11b are performed in a single step. In this manner, the semiconductor device 10B is efficiently formed.

Although the semiconductor device 10B of the BGA type having solder balls 19 attached to ball pads 11e is illustrated in FIGS. 14A and 14B, the semiconductor device 10B may be of the LGA type that does not have the solder balls 19 attached thereto.

(c) Third Embodiment

Figure 15A:
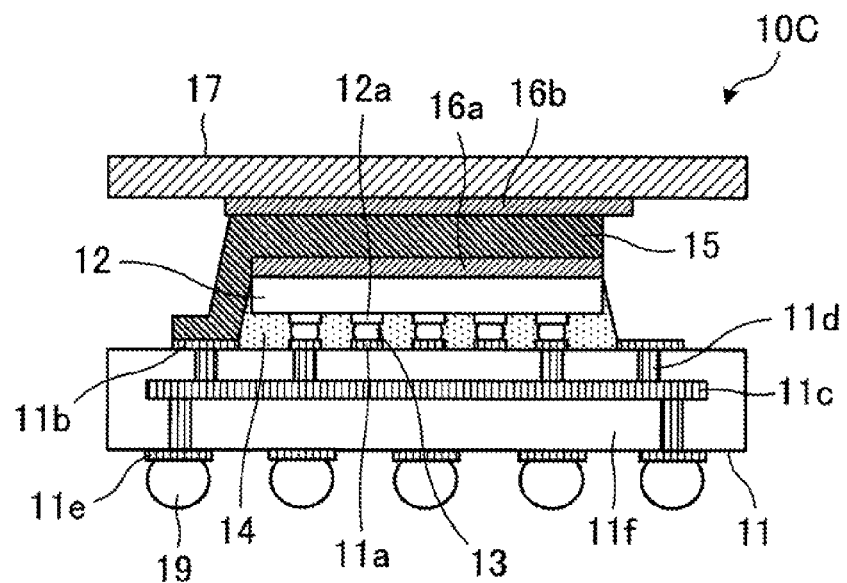
FIGS. 15A and 15B illustrate an example semiconductor device according to a third embodiment.
Figure 15B:
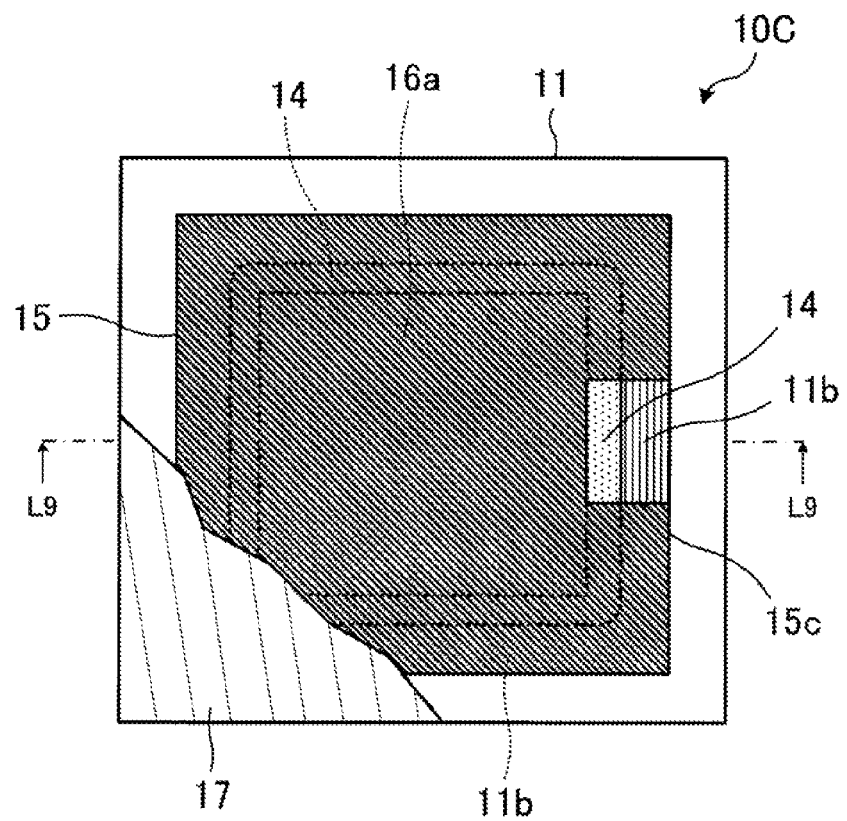

A third embodiment will now be described. FIGS. 15A and 15B illustrate an example semiconductor device according to the third embodiment. FIG. 15A is a schematic cross-section taken along line L9-L9 in FIG. 15B, and FIG. 15B is a schematic plan view.

A semiconductor device 10C according to the third embodiment differs from the semiconductor device 10B according to the second embodiment in that the semiconductor device 10C includes a heat conductive member 15 having an opening 15c. The opening 15c of the heat conductive member 15 may be used for application of an underfill resin 14 (described below).

A method of forming the semiconductor device 10C including the heat conductive member 15 having the opening 15c will now be described.

Figure 16A:
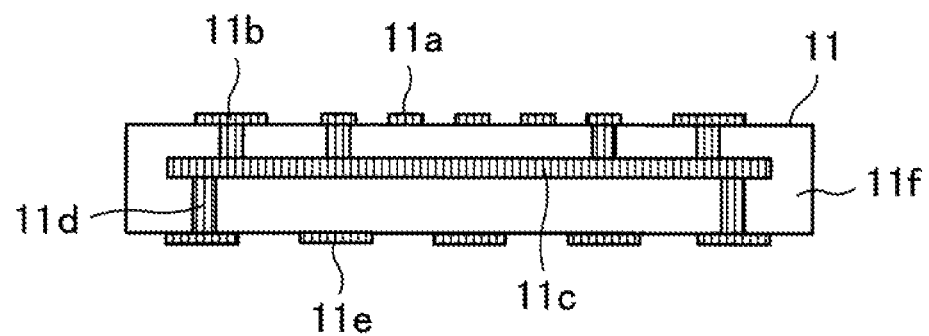
FIGS. 16A and 16B illustrate an example substrate preparation step according to the third embodiment.
Figure 16B:
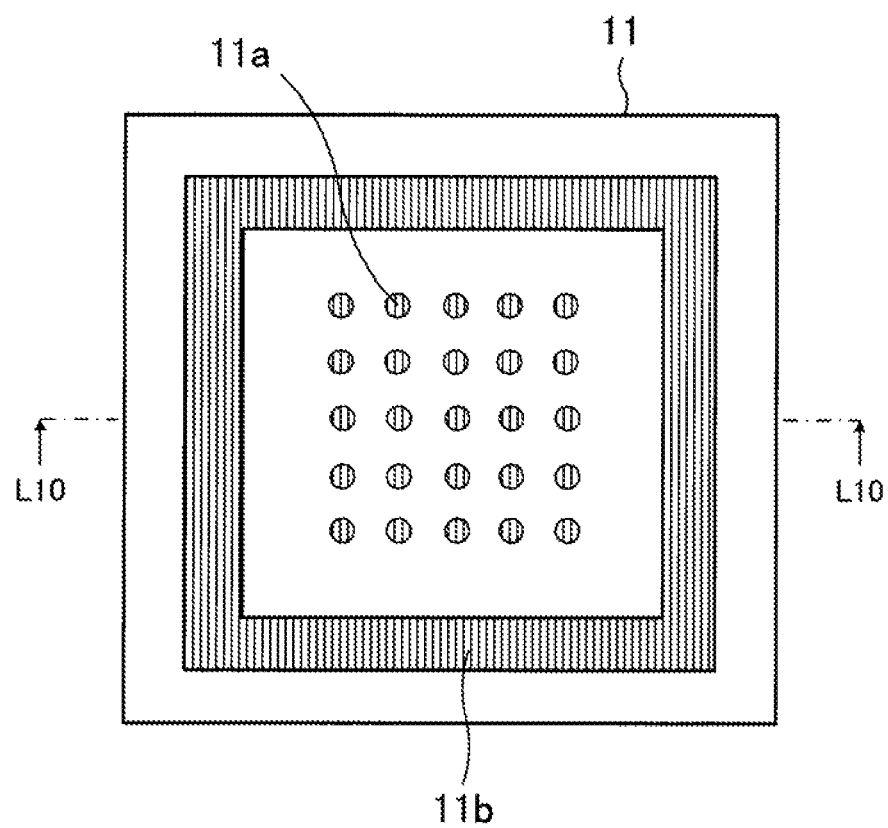

FIGS. 16A and 16B illustrate an example substrate preparation step according to the third embodiment. FIG. 16A is a schematic cross-section taken along line L10-L10 in FIG. 16B, and FIG. 16B is a schematic plan view.

First, a small substrate 11 as illustrated in FIGS. 16A and 16B is prepared. Herein, the substrate 11 has no area to which a heat radiator 17 is bonded. The substrate 11 includes substrate electrode pads 11a, a connection pad 11b, an internal wiring line 11c, vias 11d, ball pads 11e, conductive portions such as signal lines (not shown), and an insulating portion 11f. The internal wiring line 11c is at a GND potential. The substrate electrode pads 11a are disposed in an area in which a semiconductor element 12 is to be mounted, and the connection pad 11b surrounds the area.

Figure 17A:
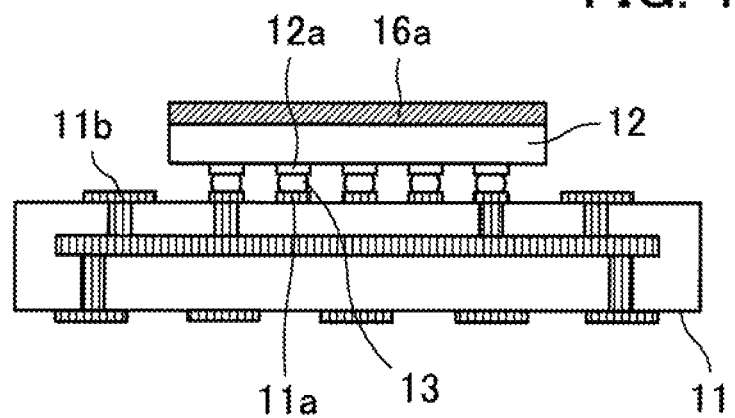
FIGS. 17A and 17B illustrate an example semiconductor-element mounting step according to the third embodiment.
Figure 17B:
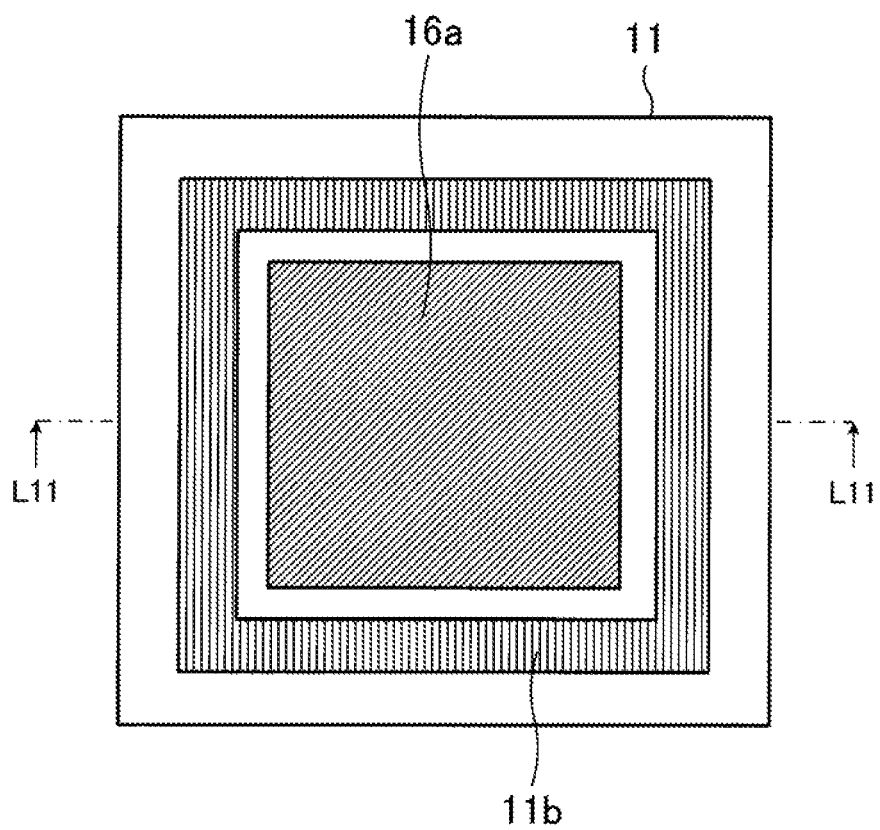

FIGS. 17A and 17B illustrate an example semiconductor-element mounting step according to the third embodiment. FIG. 17A is a schematic cross-section taken along line L11-L11 in FIG. 17B, and FIG. 17B is a schematic plan view.

The semiconductor element 12 has chip electrode pads 12a disposed on a surface thereof and a bonding layer 16a disposed on a surface opposite to that on which the chip electrode pads 12a are disposed. Bumps 13 are attached to the chip electrode pads 12a, and the semiconductor element 12 is flip-chip mounted on the substrate 11.

FIG. 18 illustrates an example sealing-member placement step according to the third embodiment.

After the semiconductor element 12 is mounted on the substrate 11, the tabular heat conductive member 15 is disposed on the bonding layer 16a provided for the semiconductor element 12, and the heat radiator 17 provided with a bonding layer 16b is disposed on the heat conductive member 15. Herein, the heat conductive member 15 has a recessed portion 15a, a connecting portion 15b, and the opening 15c communicating with the recessed portion 15a.

Figure 19A:
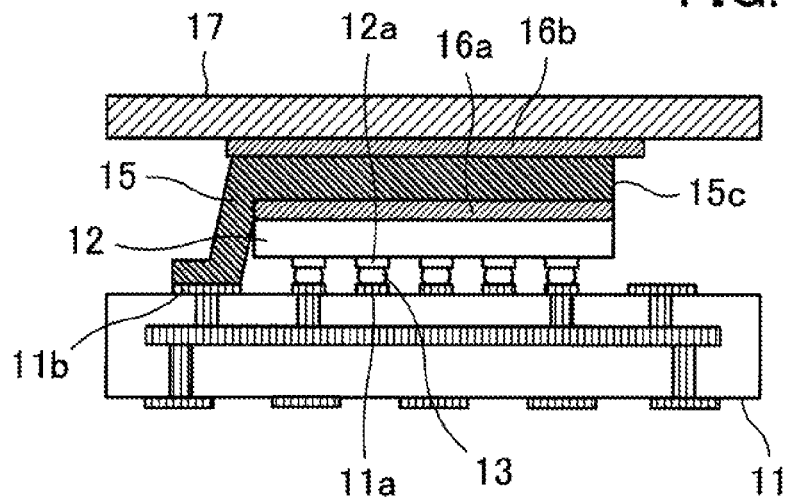
FIGS. 19A and 19B illustrate an example sealing step according to the third embodiment.
Figure 19B:
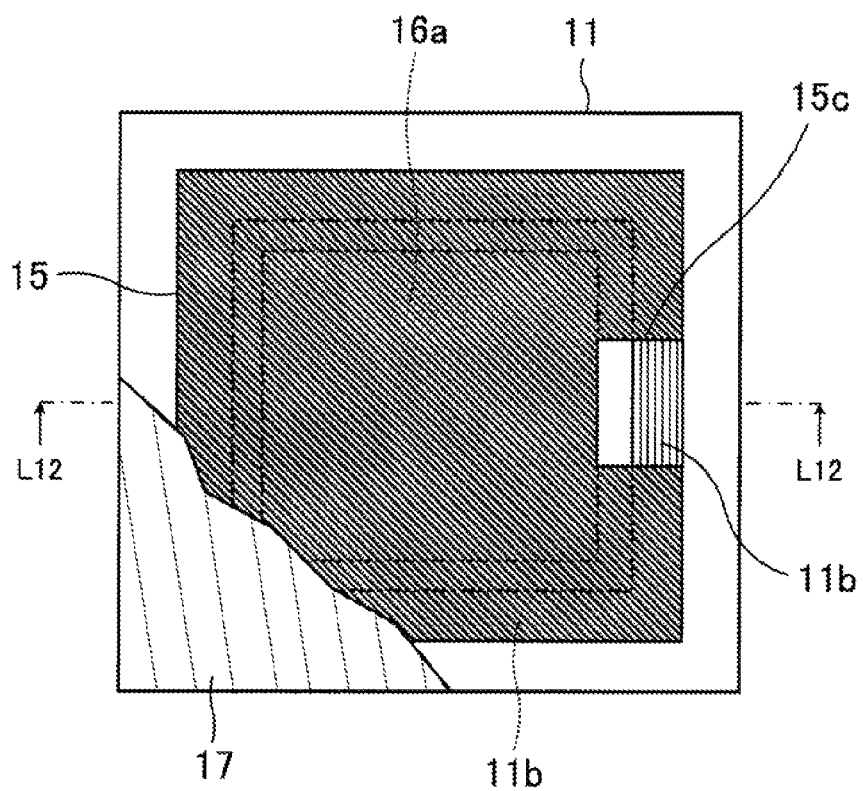

FIGS. 19A and 19B illustrate an example sealing step according to the third embodiment. FIG. 19A is a schematic cross-section taken along line L12-L12 in FIG. 19B, and FIG. 19B is a schematic plan view.

After the heat conductive member 15 and the heat radiator 17 are disposed as above, the heat radiator 17 is pressed toward the substrate 11 while, for example, the heat conductive member 15 is heated so that the heat conductive member 15 is connected to the bonding layers 16a and 16b and the connection pad 11b. At this moment, the opening 15c of the heat conductive member 15 communicates with a space between the semiconductor element 12 and the substrate 11.

Application of the underfill resin 14 is performed after the heat conductive member 15 is connected to the bonding layers 16a and 16b and the connection pad 11b.

Figure 20A:
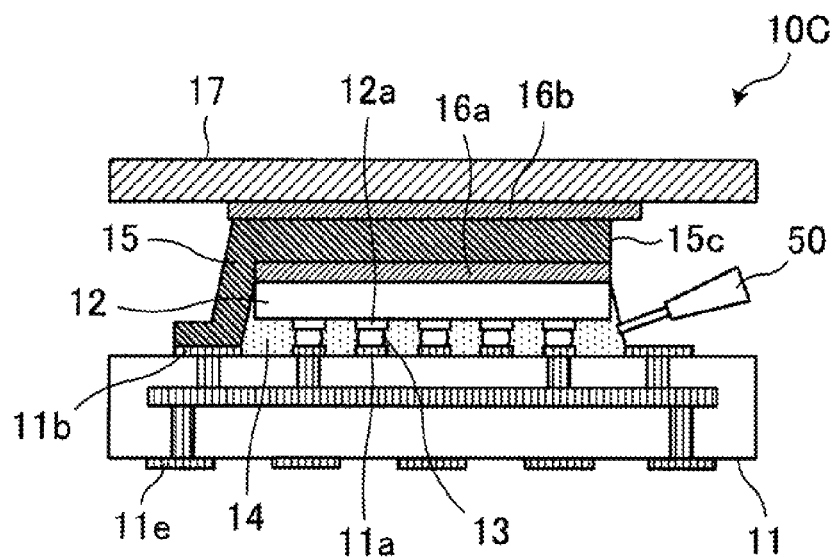
FIGS. 20A and 20B illustrate an example underfill-resin application step according to the third embodiment.
Figure 20B:
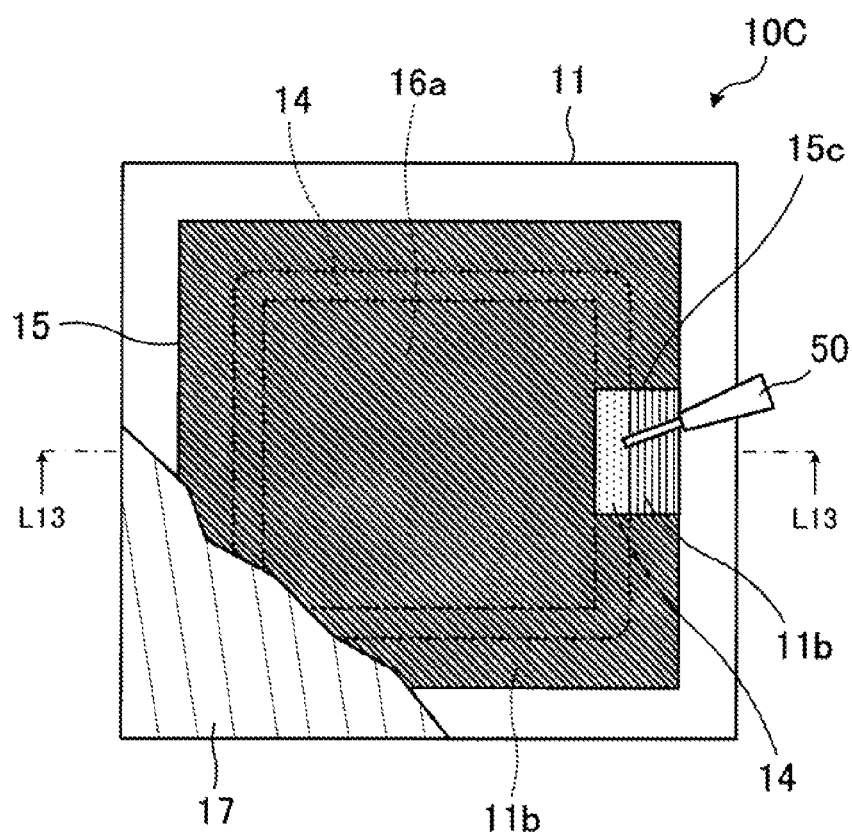

FIGS. 20A and 20B illustrate an example underfill-resin application step according to the third embodiment. FIG. 20A is a schematic cross-section taken along line L13-L13 in FIG. 20B, and FIG. 20B is a schematic plan view.

The underfill resin 14 may be applied using, for example, a dispenser. For example, the underfill resin 14 may be applied from the opening 15c of the heat conductive member 15 to the space between the semiconductor element 12 and the substrate 11 using a predetermined needle 50. During the application of the underfill resin 14, the heat conductive member 15 covering the semiconductor element 12 and connected to the connection pad 11b may function as a dam that prevents the underfill resin 14 from wetting and spreading to the outside of the area in which the semiconductor element 12 is mounted.

The size and the shape of the opening 15c of the heat conductive member 15 are not specifically limited as long as the end of the needle 50 is insertable into the opening 15c and as long as the heat conductive member 15 having the opening 15c has an electromagnetic shielding effect on the semiconductor element 12.

A semiconductor device 10C of the LGA type may be formed through the above-described steps. A semiconductor device 10C of the BGA type may be formed by attaching solder balls 19 to the ball pads 11e after the application of the underfill resin 14.

Through the above-described steps, the heat conductive member 15 reduces the risk that the underfill resin 14 may wet and spread to the outside of the area in which the semiconductor element 12 is mounted during the formation of the semiconductor device 10C.

Figure 21A:
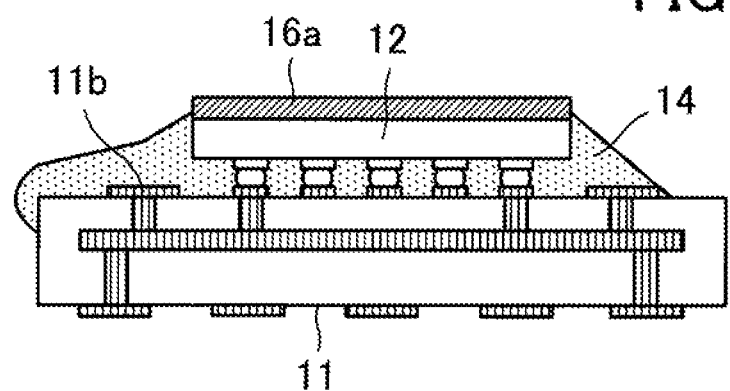
FIGS. 21A and 21B illustrate another example semiconductor-device forming step.
Figure 21B:
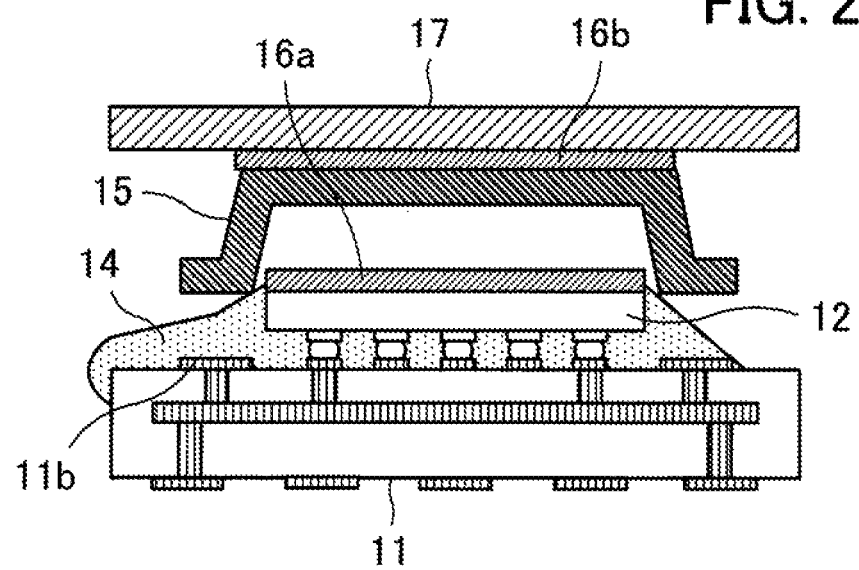

For example, in cases where the underfill resin 14 is applied to the space between the substrate 11 and the semiconductor element 12 mounted thereon before the heat conductive member 15 is connected to the bonding layers 16a and 16b and the connection pad 11b, the underfill resin 14 may wet and spread as illustrated in FIGS. 21A and 21B.

FIGS. 21A and 21B illustrate another example semiconductor-device forming step. FIG. 21A illustrates another example underfill-resin application step, and FIG. 21B illustrates another example sealing-member placement step.

When the underfill resin 14 is applied to the space between the substrate 11 and the semiconductor element 12 mounted thereon, the underfill resin 14 may wet and spread to the outside of the area in which the semiconductor element 12 is mounted. The underfill resin 14 may wet and spread due to, for example, the viscosity of the underfill resin 14, the amount of underfill resin 14 to be supplied, and the wettability of the substrate 11 by the underfill resin 14. If the underfill resin 14 wets and spreads, the connection pad 11b may be covered by the underfill resin 14 as illustrated in FIG. 21A, or the underfill resin 14 may flow out to, for example, the side surfaces of the substrate 11.

In these cases, the heat conductive member 15 may not be connected to the connection pad 11b as illustrated in FIG. 21B during placement of the heat conductive member 15 and the heat radiator 17. If the heat conductive member 15 is not connected to the substrate 11, the heat conductive member 15 may not be able to exert the electromagnetic shielding effect. In addition, if the underfill resin 14 flows out to, for example, the side surfaces of the substrate 11, the finished product (semiconductor device) may have an abnormal external shape or an abnormal appearance.

In contrast, in the semiconductor device 10C, the underfill resin 14 is applied from the opening 15c of the heat conductive member 15 to the space between the semiconductor element 12 and the substrate 11 after the heat conductive member 15 having the opening 15c is connected to, for example, the connection pad 11b. This reduces the risk that the underfill resin 14 may flow out to the outside of the area in which the semiconductor element 12 is mounted, and thus allows poor connection between the heat conductive member 15 and the connection pad 11b as illustrated in FIGS. 21A and 21B to be avoided. Furthermore, this reduces the risk that the underfill resin 14 may flow out to, for example, the side surfaces of the substrate 11, and thus allows an abnormal external shape or an abnormal appearance of the semiconductor device 10C to be avoided.

(d) Fourth Embodiment

Figure 22A:
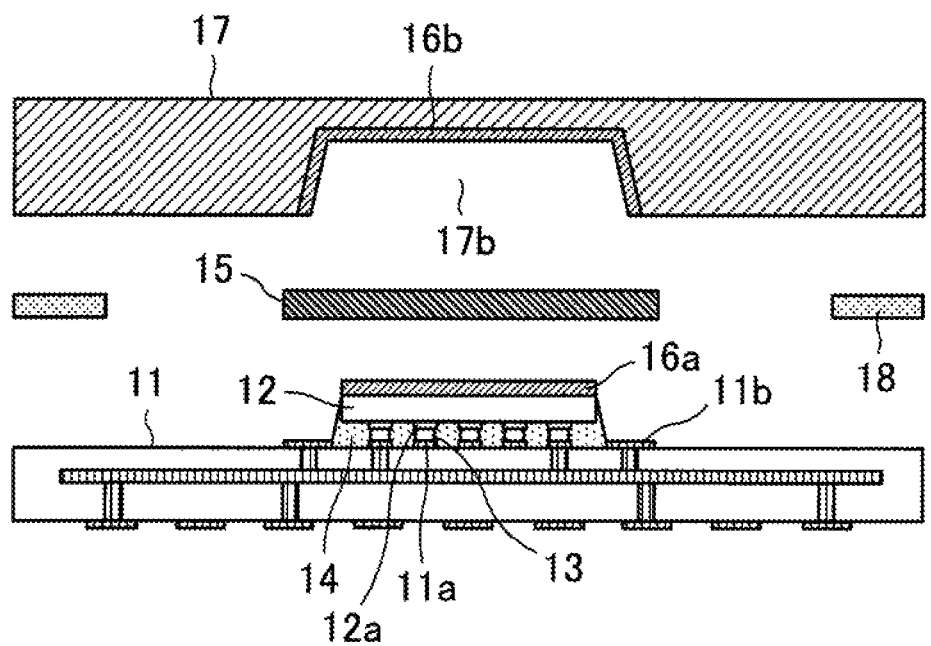
FIGS. 22A and 22B illustrate an example semiconductor device according to a fourth embodiment.
Figure 22B:
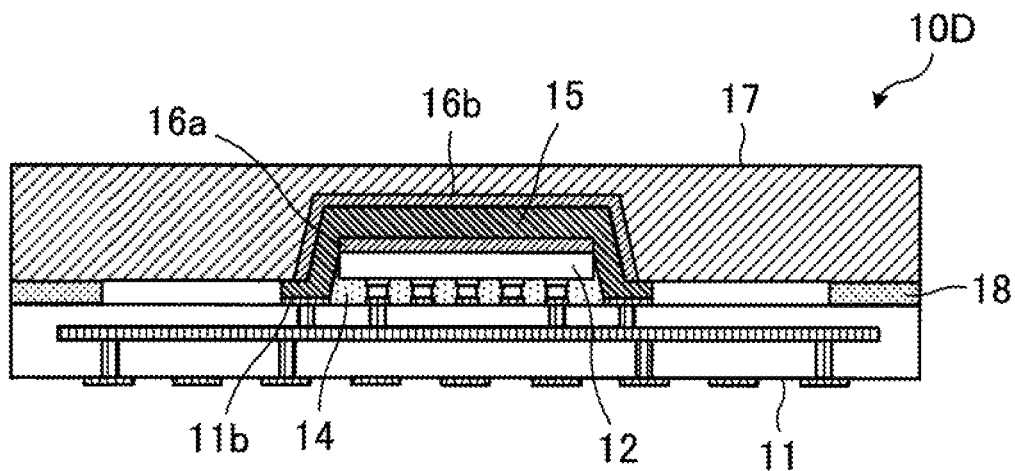

A fourth embodiment will now be described. FIGS. 22A and 22B illustrate an example semiconductor device according to the fourth embodiment.

FIGS. 22A and 22B illustrate a method of connecting a tabular heat conductive member 15 to, for example, a connection pad 11b while shaping the heat conductive member 15 using a heat radiator 17 provided with a forming die (recessed portion) 17b for shaping the heat conductive member 15 during assembling of a semiconductor device 10D, and the resultant semiconductor device 10D.

During assembling of the semiconductor device 10D, a semiconductor element 12 provided with a bonding layer 16a is first flip-chip mounted on a substrate 11. Next, the tabular heat conductive member 15, the heat radiator 17 provided with the forming die 17b for shaping the heat conductive member 15, and an adhesive 18 are disposed on the substrate 11 at predetermined positions. Subsequently, the heat radiator 17 is pressed toward the substrate 11 while, for example, the heat conductive member 15 is heated.

During pressing of the heat radiator 17, the heat conductive member 15 disposed between the semiconductor element 12 and the heat radiator 17 deforms along the forming die 17b of the heat radiator 17 while being supported by the semiconductor element 12, and covers the semiconductor element 12 (bonding layer 16a) and surfaces of an underfill resin 14. At this moment, the heat conductive member 15 is connected to the bonding layer 16a, a bonding layer 16b, and the connection pad 11b, and the heat radiator 17 is bonded to the substrate 11 with the adhesive 18 interposed therebetween.

This completes the formation of the semiconductor device 10D of the LGA type. After this, solder balls as described above may be attached to the semiconductor device 10D to form the semiconductor device 10D of the BGA type.

The use of this method eliminates the preparation for the heat conductive member 15 having a shape based on the outside size and the mounting height of the semiconductor element 12 before assembling of the semiconductor device 10D, and reduces the risk of increasing the cost (machining cost) of the heat conductive member 15.

In addition, since the heat radiator 17 is also located adjacent to the periphery of the semiconductor element 12 in the semiconductor device 10D formed using this method, the heat generated at the semiconductor element 12 is effectively transferred sideward in addition to upward, resulting in an increase in the heat release effect.

Other electronic components including passive parts such as resistors and capacitors may be mounted on the substrate 11 in addition to the semiconductor element 12. The method using the heat radiator 17 provided with the forming die 17b may also be applicable to cases where such electronic components are mounted on the substrate 11.

Figure 23A:
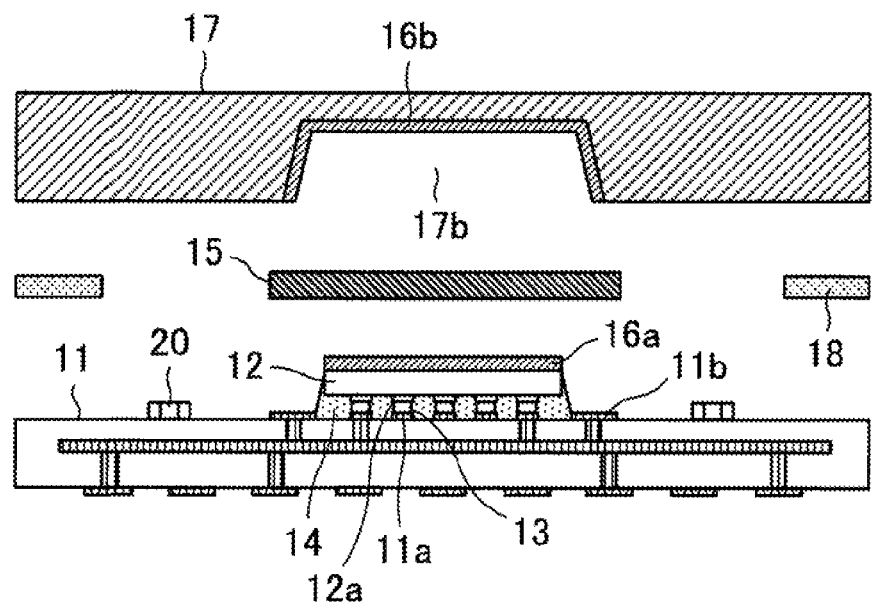
FIGS. 23A and 23B illustrate a first modification of the semiconductor device according to the fourth embodiment.
Figure 23B:
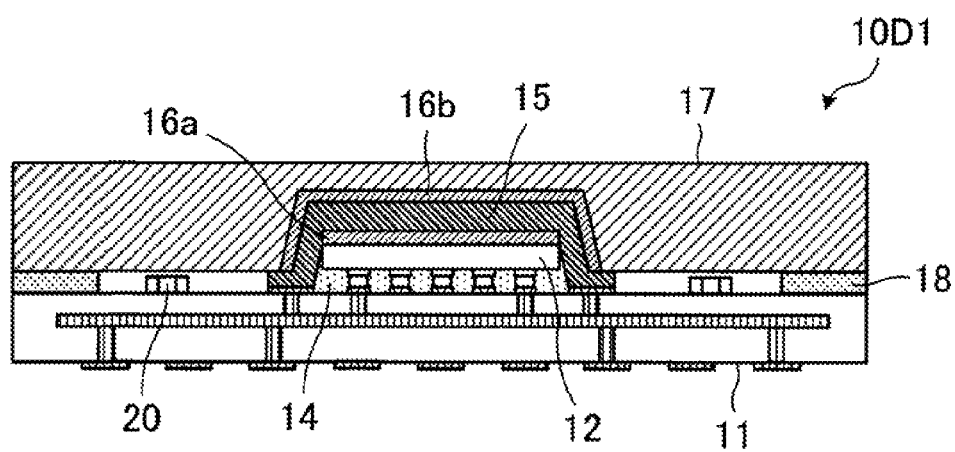

FIGS. 23A and 23B illustrate a first modification of the semiconductor device according to the fourth embodiment.

FIGS. 23A and 23B illustrate a method of shaping and connecting the tabular heat conductive member 15 using the substrate 11 on which the semiconductor element 12 and electronic components 20 are mounted and the heat radiator 17 provided with the forming die 17b, and a resultant semiconductor device 10D1.

The semiconductor device 10D1 may be assembled through the procedure similar to that for assembling the semiconductor device 10D.

During pressing of the heat radiator 17, the thickness of the adhesive 18 may be adjusted such that the contact between the lower surface of the heat radiator 17 and the electronic components 20 is avoided. In addition, the shape of the lower surface of the heat radiator 17 may be changed such that the contact between the heat radiator 17 and the electronic components 20 is avoided.

Figure 24A:
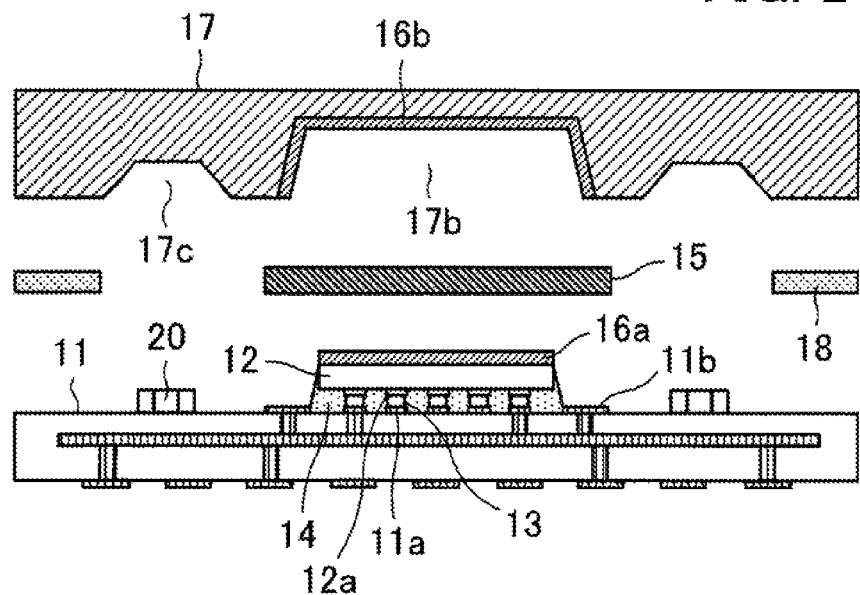
FIGS. 24A and 24B illustrate a second modification of the semiconductor device according to the fourth embodiment.
Figure 24B:
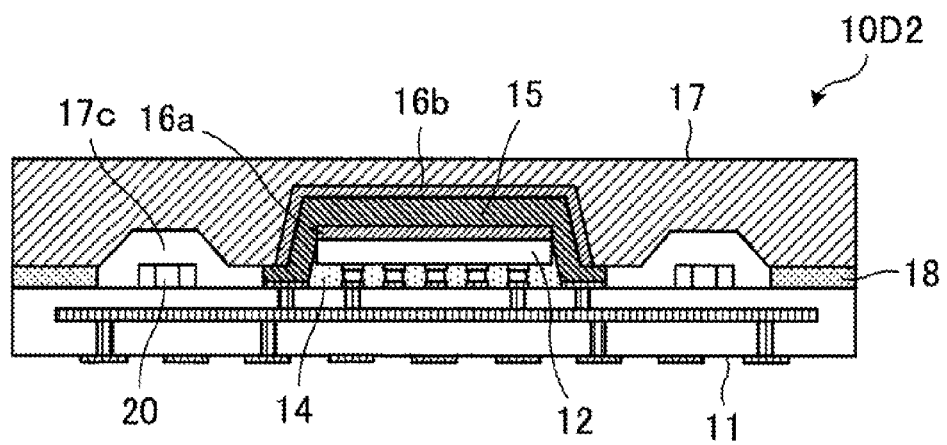

FIGS. 24A and 24B illustrate a second modification of the semiconductor device according to the fourth embodiment.

As in a semiconductor device 10D2 illustrated in FIGS. 24A and 24B, the heat radiator 17 may also have recessed portions 17c at positions opposing the electronic components 20 such that predetermined spaces are left between the heat radiator 17 and the electronic components 20 after the heat radiator 17 is bonded to the substrate 11. This allows the contact between the heat radiator 17 and the electronic components 20 to be avoided. In addition, these recessed portions 17c may increase the flexibility in the form (mounting height, type, and the like) of the electronic components 20 to be mounted on the substrate 11 together with the semiconductor element 12.

Figure 25A:
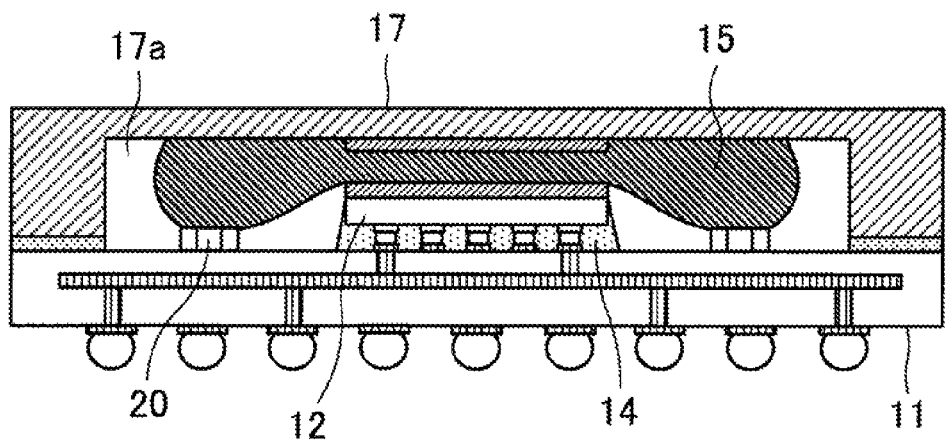
FIGS. 25A and 25B illustrate another example semiconductor-device forming step.
Figure 25B:
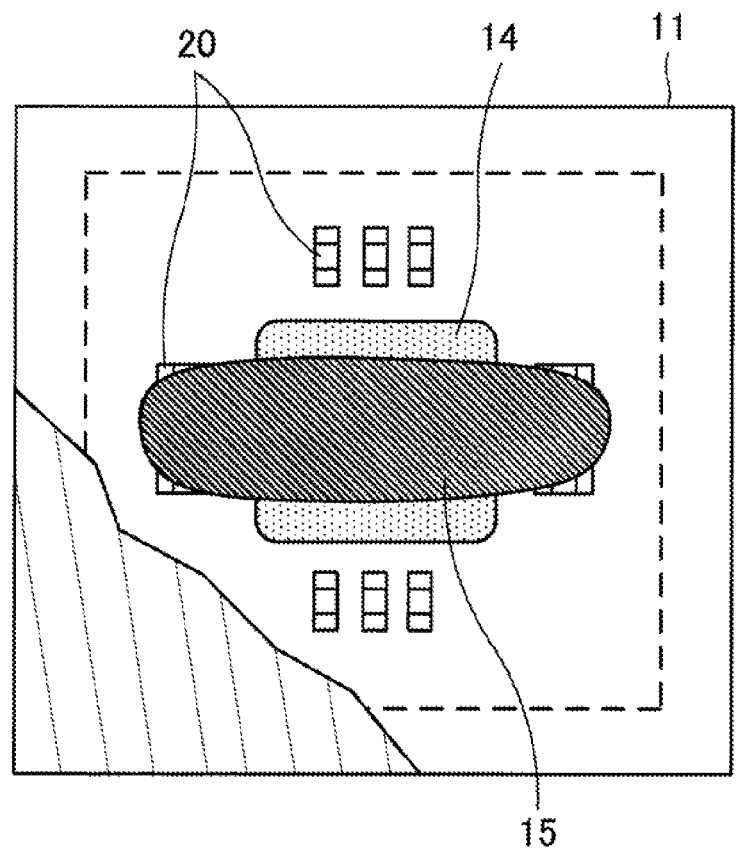

If a heat radiator 17 without the forming die 17b is used for the tabular heat conductive member 15, the heat conductive member 15 may spread as illustrated in FIGS. 25A and 25B when the heat conductive member 15 is connected to the substrate 11 on which the semiconductor element 12 and the electronic components 20 are mounted.

FIGS. 25A and 25B illustrate another example semiconductor-device forming step. FIG. 25A is a schematic cross-section, and FIG. 25B is a schematic plan view.

Herein, the tabular heat conductive member 15 is disposed between the heat radiator 17 provided with a recessed portion 17a and the substrate 11 on which the semiconductor element 12 and the electronic components 20 are mounted, and the heat radiator 17 is pressed toward the substrate 11. When the heat radiator 17 is pressed while the heat conductive member 15 is heated, the heat conductive member 15 may be extruded from between the heat radiator 17 and the semiconductor element 12 by the pressure, and may spread to the electronic components 20 mounted on the periphery of the semiconductor element 12 as illustrated in FIGS. 25A and 25B.

If the heat conductive member 15 spreads as described above and comes into contact with the electronic components 20, for example, the electronic components 20 may not function normally. For example, when the heat conductive member 15 spreading as described above comes into contact with chip capacitors serving as the electronic components 20, the chip capacitors may short-circuit.

Figure 26A:
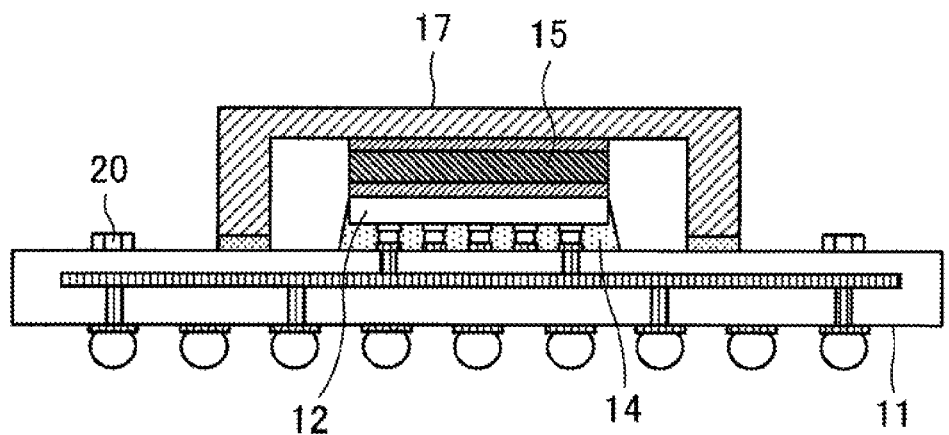
FIGS. 26A and 26B illustrate semiconductor devices of other forms.
Figure 26B:
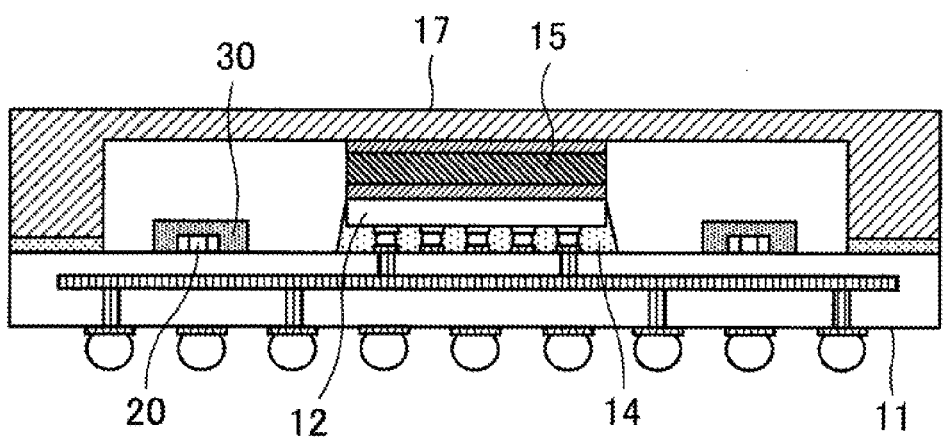

To avoid failures such as short circuits of the electronic components 20, structures as illustrated in FIGS. 26A and 26B may be adopted.

FIGS. 26A and 26B illustrate semiconductor devices of other forms.

For example, the electronic components 20 are disposed outside the heat radiator 17 in the structure illustrated in FIG. 26A. In the structure illustrated in FIG. 26B, the electronic components 20 mounted inside the heat radiator 17 are coated by resins 30.

In the structure as illustrated in FIG. 26A, however, inductance or resistance of wiring lines inside the substrate 11 may increase due to the long distances between the semiconductor element 12 and the electronic components 20, and this may result in an increase in switching noise. In addition, a step of forming the resins 30 is necessary for the structure illustrated in FIG. 26B, and fabrication of the resins 30 may result in an increase in cost.

Meanwhile, the heat radiator 17 provided with the forming die 17b reduces the risk that the heat conductive member 15 may spread to the electronic components 20 in cases where the electronic components 20 are mounted on the periphery of the semiconductor element 12. This allows the contact between the heat conductive member 15 and the electronic components 20 to be avoided, and thus allows failures caused by the contact to be avoided.

The above-described electronic components 20 may be mounted on the substrate 11 of the semiconductor device 10A described in the first embodiment. Since the semiconductor device 10A includes the heat conductive member 15 having predetermined size and shape, contact between the heat conductive member 15 and the electronic components 20 and failures caused by the contact may be avoided.

(e) Fifth Embodiment

Figure 27A:
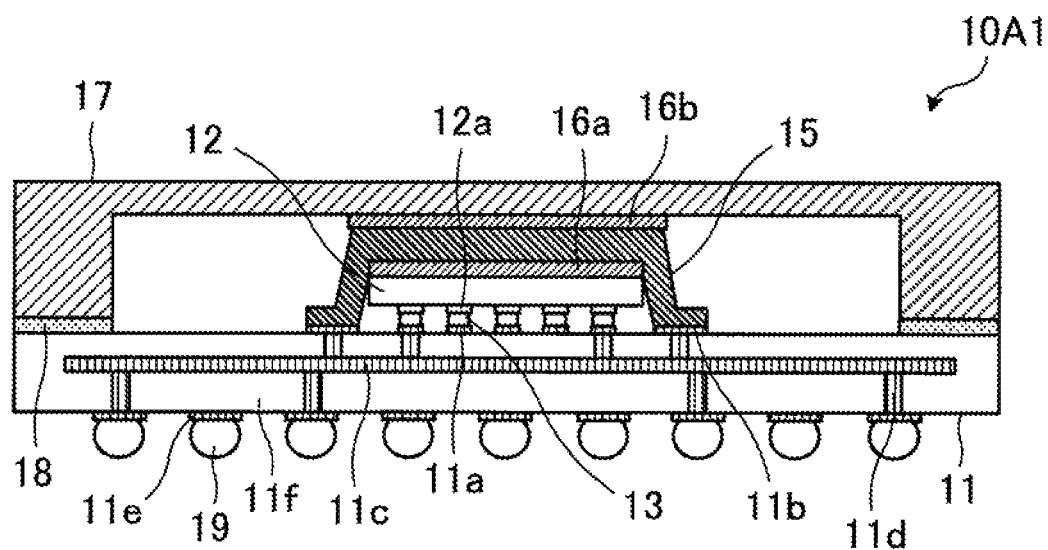
FIGS. 27A and 27B illustrate an example semiconductor device according to a fifth embodiment.
Figure 27B:
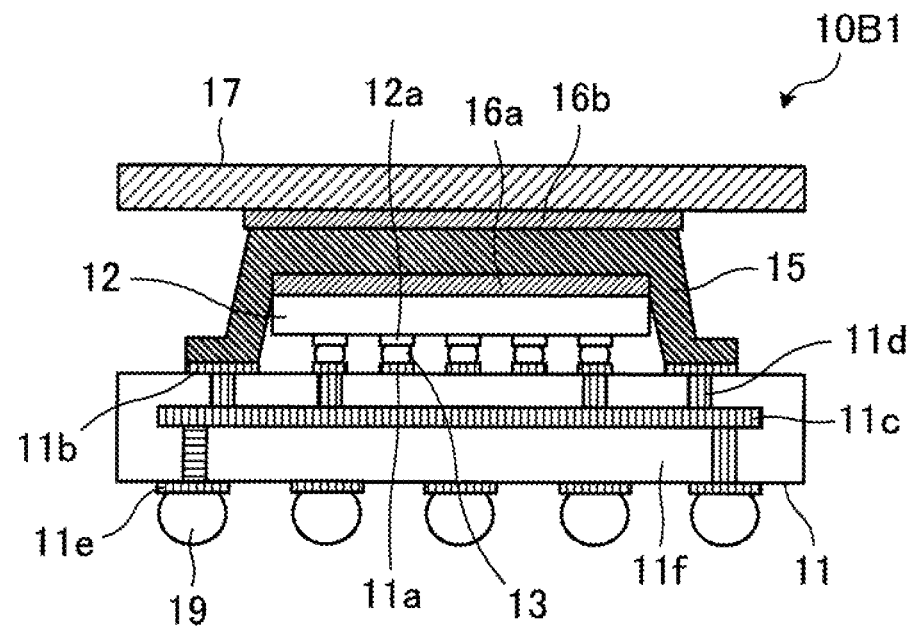

Next, a fifth embodiment will be described. FIGS. 27A and 27B illustrate an example semiconductor device according to the fifth embodiment.

Although the semiconductor devices according to the first and second embodiments include the underfill resin 14 disposed between the substrate 11 and the semiconductor element 12 mounted thereon, such an underfill resin is not always necessary in the fifth embodiment. As in a semiconductor device 10A1 illustrated in FIG. 27A and a semiconductor device 10B1 illustrated in FIG. 27B, a semiconductor element 12 may be covered by a heat conductive member 15 without an underfill resin, and the semiconductor element 12 may be thermally connected to a heat radiator 17 with the heat conductive member 15 interposed therebetween.

In the semiconductor device 10A1 illustrated in FIG. 27A and the semiconductor device 10B1 in FIG. 27B, the semiconductor element 12 is covered by the heat conductive member 15, and the heat conductive member 15 is connected to a connection pad 11b and a bonding layer 16a. That is, the heat conductive member 15 reinforces the connection between the semiconductor element 12 and a substrate 11 via bumps 13.

Therefore, for example, even if differences in thermal expansion and thermal shrinkage between the semiconductor element 12 and the substrate 11 cause a warp of the semiconductor element 12 during heating and cooling performed after the semiconductor element 12 is mounted, the heat conductive member 15 reinforces the connection between the semiconductor element 12 and the substrate 11, and ensures a certain reliability of connections. Even if an impact is given to the semiconductor devices 10A1 and 10B1 from the outside, the heat conductive member 15 similarly ensures a certain reliability of connections.

The material cost of the underfill resin 14 and the step of forming the underfill resin 14 are unnecessary for the semiconductor devices 10A1 and 10B1.

The semiconductor devices 10A1 and 10B1, having the same structures as the semiconductor devices 10A and 10B, respectively, except that the underfill resin 14 is omitted therefrom have been illustrated as examples. Similarly, structures obtained by omitting the underfill resin 14 from the semiconductor devices 10D, 10D1, and 10D2 described in the fourth embodiment may also be adopted.

(f) Sixth Embodiment

Figure 28A:
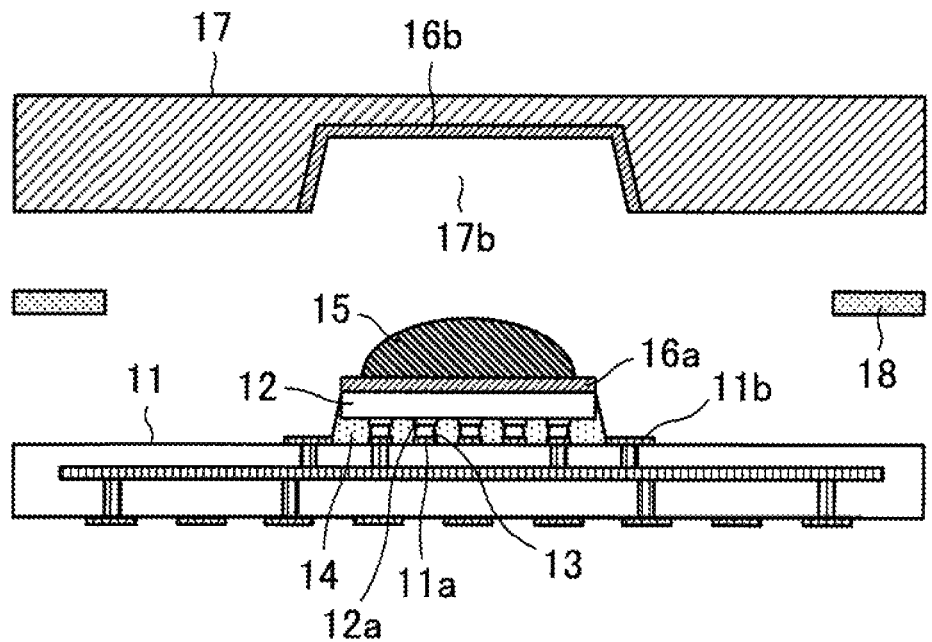
FIGS. 28A and 28B illustrate an example semiconductor device according to a sixth embodiment.
Figure 28B:
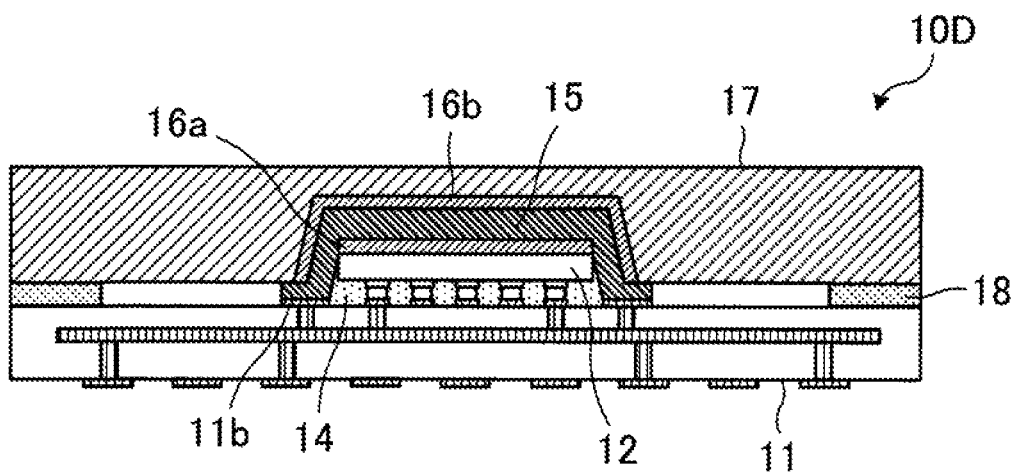

A sixth embodiment will now be described. FIGS. 28A and 28B illustrate an example semiconductor device according to the sixth embodiment.

In the fourth embodiment, the tabular heat conductive member 15 is connected to the bonding layers 16a and 16b and the connection pad 11b so as to cover the semiconductor element 12 while being shaped by the heat radiator 17 provided with the forming die 17b. Instead of the tabular heat conductive member 15, a heat conductive member 15 in paste form as illustrated in FIGS. 28A and 28B may be used.

In this case, the heat conductive member 15 in paste form is disposed on a bonding layer 16a of a semiconductor element 12 mounted on a substrate 11, and a heat radiator 17, provided with a forming die 17b and a bonding layer 16b, and an adhesive 18 are disposed at predetermined positions. The heat radiator 17 is pressed toward the substrate 11 so that the heat conductive member 15 deforms along the forming die 17b to cover the semiconductor element 12 (bonding layer 16a) and surfaces of an underfill resin 14. The heat conductive member 15 is connected to the bonding layers 16a and 16b and the connection pad 11b, and the heat radiator 17 is bonded to the substrate 11 by the adhesive 18.

This completes the formation of the semiconductor device 10D of the LGA type. After this, solder balls as described above may be attached to the semiconductor device 10D to form the semiconductor device 10D of the BGA type.

The use of the above-described method produces effects similar to those described in the fourth embodiment. Furthermore, the use of the heat conductive member 15 in paste form may reduce the material and machining cost compared with the case where the tabular heat conductive member 15 or 150 is used.

The heat conductive member 15 in paste form may also be used when electronic components 20 as described in the fourth embodiment are mounted on the substrate 11. In this case, the heat radiator 17 may have recessed portions 17c at positions opposing the electronic components 20.

Next, adhesiveness between the heat conductive member 15 and the semiconductor element 12 and between the heat conductive member 15 and the underfill resin 14 will be described with reference to FIGS. 29 to 31B.

Figure 29:
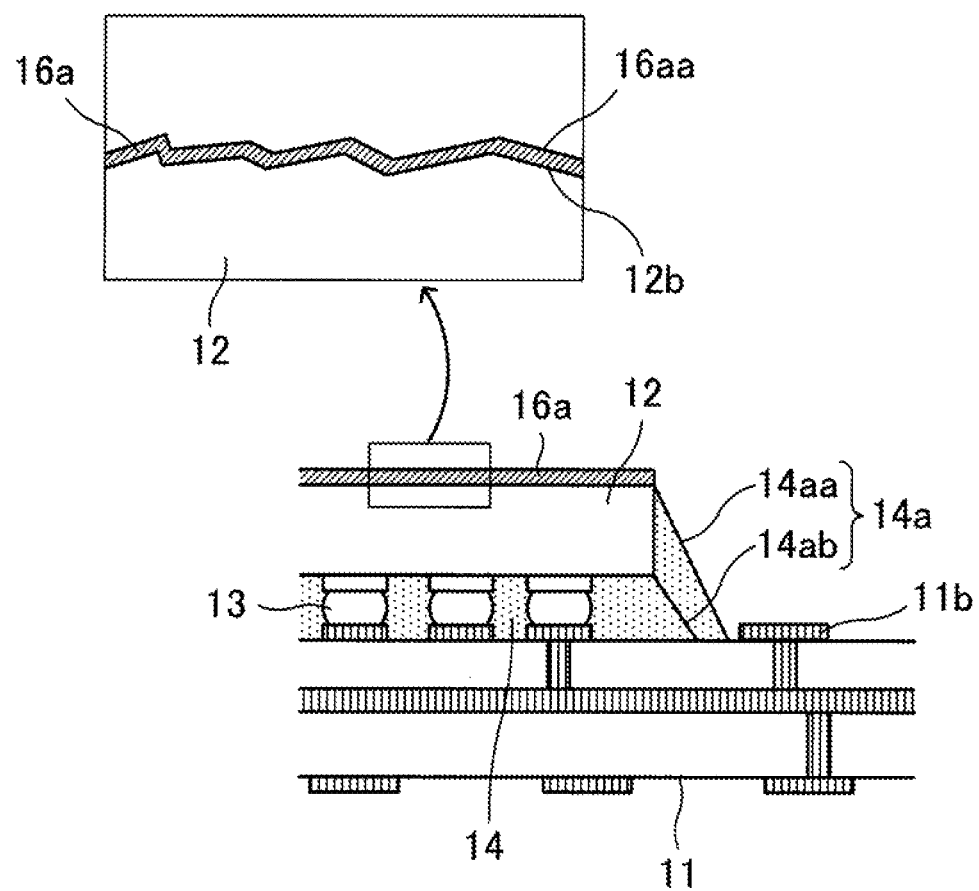
FIG. 29 is a first graph illustrating adhesiveness of a heat conductive member.

As illustrated in FIG. 29, an uneven portion 12b may exist on the rear surface (surface opposite to that to which bumps 13 are attached) of the semiconductor element 12. This uneven portion 12b is formed by back-grinding of a semiconductor substrate performed during forming of the semiconductor element 12. Even when the bonding layer 16a is formed on the surface having the uneven portion 12b, an uneven portion 16aa may remain on a side of the semiconductor element 12 adjacent to the rear surface. In addition, the underfill resin 14 includes fillet portions 14a at side ends of the semiconductor element 12, and the height of the fillet portions 14a may vary (high fillet portions 14aa or low fillet portions 14ab) depending on the amount of the underfill resin 14 to be supplied.

The heat conductive member 15 is disposed so as to cover the bonding layer 16a on the semiconductor element 12 and the underfill resin 14, the bonding layer 16a potentially having the uneven portion 16aa and the underfill resin 14 having the fillet portions 14a whose shape potentially varying. The heat conductive member 15 is preferably brought into close contact with the surface of the bonding layer 16a, the side surfaces of the semiconductor element 12, and the surfaces of the underfill resin 14 such that the least gaps are left between these components in view of efficiency of heat transfer from the semiconductor element 12 to the heat radiator 17.

In this regard, the heat radiator 17 is disposed on the semiconductor element 12 provided with the bonding layer 16a with the heat conductive member 15 interposed therebetween, and the heat radiator 17 is pressed toward the substrate 11 on which the semiconductor element 12 is mounted during assembling in the first to sixth embodiments. This reduces the risk that gaps may be left between the heat conductive member and the semiconductor element 12 provided with the bonding layer 16a and between the heat conductive member 15 and the underfill resin 14.

Figure 30A:
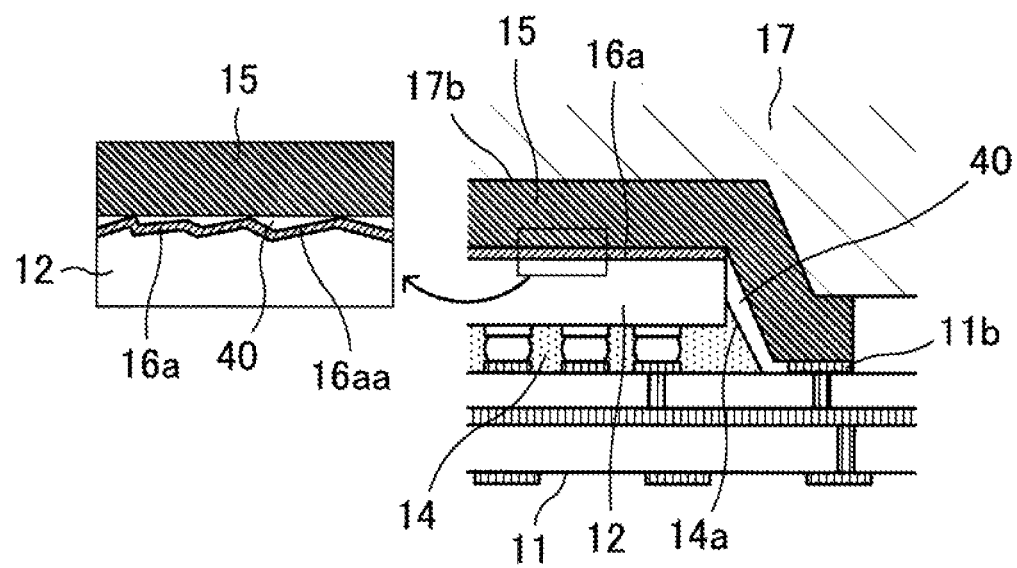
FIGS. 30A and 30B are second graphs illustrating the adhesiveness of the heat conductive member.
Figure 30B:
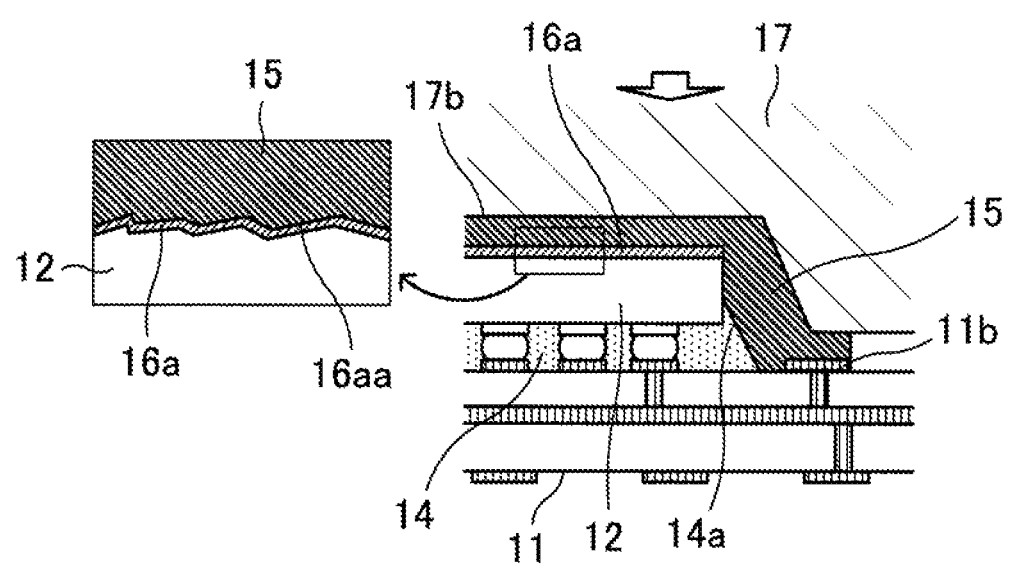

For example, FIGS. 30A and 30B illustrate connection of the heat conductive member 15 to the connection pad 11b and the like while the heat conductive member 15 is being shaped by the heat radiator 17 provided with the forming die 17b.

In this case, as illustrated in FIG. 30A, gaps 40 are left between the heat conductive member 15 and the uneven portion 16aa of the bonding layer 16a, between the heat conductive member 15 and the side surfaces of the semiconductor element 12, and between the heat conductive member 15 and the underfill resin 14 during pressing of the heat radiator 17. However, the heat conductive member 15 deforms along the surface of the uneven portion 16aa of the bonding layer 16a, the side surfaces of the semiconductor element 12, and the surfaces of the fillet portions 14a of the underfill resin 14 as illustrated in FIG. 30B by further pressing the heat radiator 17. In this manner, the heat conductive member 15 is brought into close contact with the surfaces of the bonding layer 16a, the semiconductor element 12, and the underfill resin 14.

To do this, the thickness of the heat conductive member 15 to be used and the pressure (load) to the heat radiator 17 necessary for the close contact may be determined in advance.

Since the heat conductive member 15 melted by heating and the heat conductive member 15 in paste form are fluid, the heat conductive member 15 may flow along and be brought into close contact with the surfaces of the bonding layer 16a, the semiconductor element 12, and the underfill resin 14.

Figure 31A:
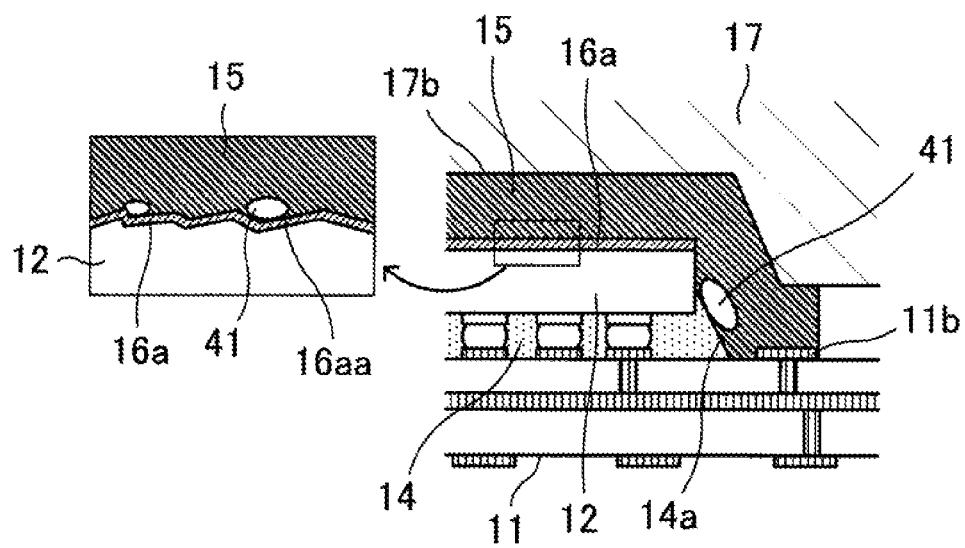
FIGS. 31A and 31B are third graphs illustrating the adhesiveness of the heat conductive member.
Figure 31B:
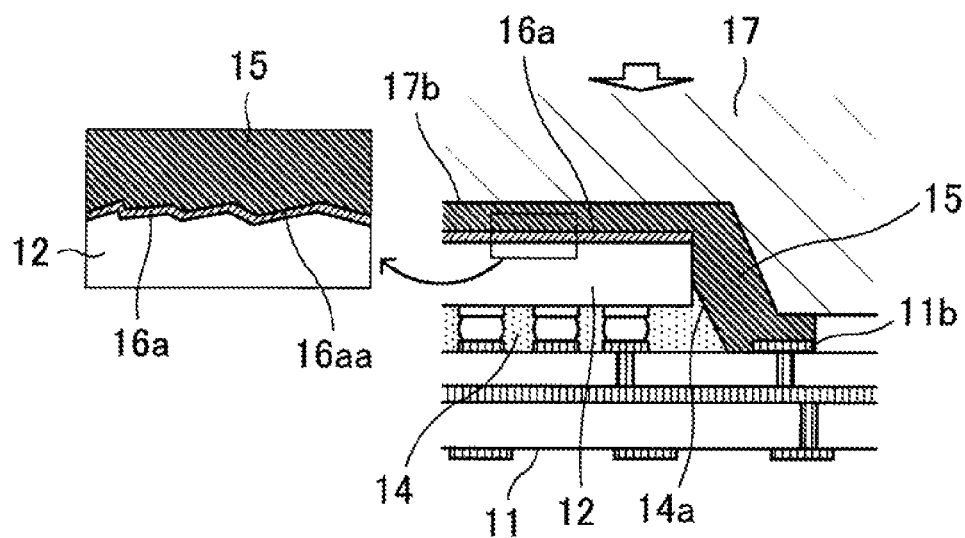

At this moment, however, as illustrated in FIG. 31A, air gaps (voids) 41 may be formed between the heat conductive member 15 and the surfaces of the bonding layer 16a, the semiconductor element 12, and the underfill resin 14. In this case, the air gaps 41 may be removed or reduced as illustrated in FIG. 31B by applying pressure to the heat conductive member 15 while heating the heat conductive member 15 using a pressure oven and the like such that the air gaps 41 are crushed and then by cooling and hardening the heat conductive member 15. Alternatively, the air gaps 41 may be removed or reduced as illustrated in FIG. 31B by heating the heat conductive member 15 such that the heat conductive member 15 is softened or melted, by drawing a vacuum in this state, and then by cooling and hardening the heat conductive member 15.

In this manner, placing the heat conductive member 15 between the heat radiator 17 and the semiconductor element 12 on the substrate 11 and pressing the heat radiator 17 toward the substrate 11 while heating as needed may increase the adhesiveness between the heat conductive member 15 and the bonding layer 16a, between the heat conductive member 15 and the semiconductor element 12, and between the heat conductive member 15 and the underfill resin 14. This allows the heat generated at the semiconductor element 12 to be efficiently transferred to the heat radiator 17 via the heat conductive member 15, and thereby effectively reduces the risk of malfunction or breakage of the semiconductor element 12 caused by overheating.

Although the adhesiveness of the heat conductive member 15 in cases where the heat radiator 17 has the forming die 17b has been described with reference to FIGS. 30A to 31B, certain adhesiveness of the conductive member 15 may also be obtained in cases where the heat radiator 17 has the recessed portion 17a or where the heat radiator 17 is tabular. For example, pressing the heat conductive member 15 provided with the recessed portion 15a having appropriately set size and shape using the heat radiator 17 provided with the recessed portion 17a or using the tabular heat radiator 17 ensures certain adhesiveness between the heat conductive member 15 and the bonding layer 16a, between the heat conductive member 15 and the semiconductor element 12, and between the heat conductive member 15 and the underfill resin 14.

In the first to sixth embodiments, the semiconductor element is thermally connected to the heat radiator with the heat conductive member interposed therebetween, and the heat conductive member is connected to the electrode portion, at the GND potential, of the substrate while covering the semiconductor element. This allows the heat generated at the semiconductor element to be efficiently transferred to the heat radiator via the heat conductive member while the periphery of the semiconductor element is electromagnetically shielded by the heat conductive member. The heat conductive member covering the semiconductor element and connected to the predetermined electrode portion of the substrate may be formed by pressing the heat radiator toward the substrate without increasing the number of parts or the number of processing steps. This leads to a semiconductor device having functions of heat dissipation and electromagnetic shielding without the risk of increasing the cost. This also leads to an increase in efficiency of manufacturing the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A method of manufacturing a semiconductor device, the method comprising:
    placing a semiconductor element on a substrate that includes electrode portion formed thereon;
    placing a heat radiator on the semiconductor element with a heat conductive member interposed therebetween, the heat conductive member being composed of a solder material; and
    pressing the heat radiator such that the heat conductive member covers the semiconductor element and such that the heat conductive member is connected to the electrode portion.

2. The method according to claim 1, wherein the placing the heat radiator places the heat radiator on the semiconductor element with the heat conductive member interposed therebetween, the heat conductive member covering the semiconductor element.

3. The method according to claim 2, wherein the heat conductive member is in contact with the electrode portion.

4. The method according to claim 1, wherein the placing the heat radiator places the heat radiator on the semiconductor element with the heat conductive member interposed therebetween, the heat conductive member that includes an opening, the method further comprising:
    supplying resin from the opening of the heat conductive member after the pressing the heat radiator.

5. The method according to claim 1, wherein
    the placing the heat radiator places the heat radiator that includes a recessed portion such that the recessed portion faces the heat conductive member, and
    the pressing the heat radiator shapes the heat conductive member using the recessed portion such that the heat conductive member covers the semiconductor element and such that the heat conductive member is connected to the electrode portion.

6. The method according to claim 1, wherein the pressing the heat radiator includes heating the heat conductive member.

* * * * *